US012660660B2

(12) United States Patent
Miyazaki

(10) Patent No.:  US 12,660,660 B2
(45) Date of Patent:      Jun. 16, 2026

(54) SEMICONDUCTOR DEVICE

(71) Applicant: ROHM CO., LTD., Kyoto (JP)

(72) Inventor: Hiroki Miyazaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 549 days.

(21) Appl. No.: 18/257,186

(22) PCT Filed: Dec. 10, 2021

(86) PCT No.: PCT/JP2021/045433
§ 371 (c)(1),
(2) Date: Jun. 13, 2023

(87) PCT Pub. No.: WO2022/131142
PCT Pub. Date: Jun. 23, 2022

(65) Prior Publication Data
US 2024/0038640 A1      Feb. 1, 2024

(30) Foreign Application Priority Data

Dec. 16, 2020    (JP) ................................. 2020-208369

(51) Int. Cl.
*H10W 70/65*         (2026.01)
*H10W 70/685*        (2026.01)
(Continued)

(52) U.S. Cl.
CPC ......... *H10W 70/657* (2026.01); *H10W 70/65* (2026.01); *H10W 70/685* (2026.01); *H10W 74/476* (2026.01); *H10W 74/40* (2026.01)

(58) Field of Classification Search
CPC . H10W 70/657; H10W 70/65; H10W 70/685; H10W 74/476; H10W 74/40;
(Continued)

(56) References Cited

U.S. PATENT DOCUMENTS

2001/0038531 A1*  11/2001  Asai ........................ H01L 23/50
                                                           174/250
2018/0138115 A1*   5/2018  Lu ...................... H01L 23/49827
2020/0273834 A1*   8/2020  Yanagida ............ H01L 21/6835

FOREIGN PATENT DOCUMENTS

JP         2013197263 A      9/2013
JP         2020027850 A  *   2/2020

OTHER PUBLICATIONS

International Search Report and Written Opinion issued for International Patent Application No. PCT/JP2021/045433, Date of mailing: Feb. 22, 2022, 8 pages including English translation of Search Report.

(Continued)

*Primary Examiner* — Dale E Page
*Assistant Examiner* — Daniel J Hibbert
(74) *Attorney, Agent, or Firm* — HSML P.C.

(57) ABSTRACT

This semiconductor device comprises a substrate, a first wiring part, a second wiring part, and a semiconductor element. The first wiring part includes a first through-electrode, first main-surface wiring, and a first wiring electrode. The second wiring section includes a second through-electrode, second main-surface wiring, and a second wiring electrode. An upper surface is depressed toward the interior of the first through-electrode. The first wiring electrode is joined to a first element electrode of the semiconductor element by a first joining member. The second wiring electrode is joined to a second element electrode of the semiconductor element by a second joining member. The first wiring electrode, which is formed on an upper surface of the first main-surface wiring, is larger than the second wiring electrode, which is formed on an upper surface of the second main-surface wiring, as seen from the thickness direction.

23 Claims, 30 Drawing Sheets

(51) Int. Cl.
   *H10W 74/47* (2026.01)
   *H10W 74/40* (2026.01)

(58) Field of Classification Search
   CPC ... H01L 21/568; H01L 21/6836; H01L 24/08;
        H01L 21/561; H01L 23/3121; H01L
        2221/68331; H01L 2221/68345; H01L
        21/6835; H01L 23/3677; H01L 24/13;
        H01L 24/16; H01L 23/49805; H01L
        2224/81193
   See application file for complete search history.

(56) References Cited

OTHER PUBLICATIONS

Office Action issued for German Patent Application No. 112021005888.
6, dated Jun. 10, 2025, 13 pages including English machine trans-
lation.

\* cited by examiner

SEMICONDUCTOR DEVICE

TECHNICAL FIELD

The present disclosure relates to a semiconductor device.

BACKGROUND ART

An electronic component having an element, such as a resistor or a semiconductor chip, includes a substrate on which the element is mounted and an encapsulation resin that covers the element. Patent literature 1 discloses an example of a semiconductor device including a wiring body and an encapsulation resin. External connection terminals are formed on one surface of the wiring body, and a semiconductor element is mounted on the other surface of the wiring body encapsulated in the encapsulation resin.

CITATION LIST

Patent Literature

Patent Literature 1: Japanese Laid-Open Patent Publication No. 2013-197263

SUMMARY OF INVENTION

Technical Problem

The semiconductor element is connected by solder to a conductive layer of the wiring body. The state of the wiring body may cause a connection failure between the semiconductor element and the wiring body, or a mounting failure of the semiconductor element.

Solution to Problem

A semiconductor device according to one aspect of the present disclosure includes a substrate, a semiconductor element, a first through-electrode, a second through-electrode, a first main surface wiring line, a second main surface wiring line, a first wiring line electrode, a second wiring line electrode, a first joining member, and a second joining member. The substrate includes a substrate main surface facing a thickness direction. The semiconductor element includes an element main surface facing the substrate main surface, a first element electrode formed on the element main surface, and a second element electrode formed on the element main surface. The first through-electrode extends through the substrate and includes a first electrode upper surface facing the same direction as the substrate main surface. The second through-electrode extends through the substrate and includes a second electrode upper surface facing the same direction as the substrate main surface. The first main surface wiring line contacts the substrate main surface and the first electrode upper surface and includes a first wiring line upper surface facing the same direction as the substrate main surface. The second main surface wiring line contacts the second electrode upper surface and includes a second wire upper surface facing the same direction as the substrate main surface. The first wiring line electrode is formed on the first wiring line upper surface. The second wiring line electrode is formed on the second wire upper surface. The first joining member joins the first element electrode and the first wiring line electrode. The second joining member joins the second element electrode and the second wiring line electrode. The first electrode upper surface is recessed into the first through-electrode. The second electrode upper surface is recessed into the second through-electrode. The first wiring line electrode is larger than the second wiring line electrode, as viewed in the thickness direction.

A semiconductor device according to a further aspect of the present disclosure includes a substrate, a semiconductor element, a first through-electrode, a second through-electrode, a first main surface wiring line, a second main surface wiring line, a first wiring line electrode, a second wiring line electrode, a first joining member, and a second joining member. The substrate includes a substrate main surface facing a thickness direction. The semiconductor element includes an element main surface facing the substrate main surface, a first element electrode formed on the element main surface, and a second element electrode formed on the element main surface. The first through-electrode extends through the substrate and includes a first electrode upper surface facing the same direction as the substrate main surface. The second through-electrode extends through the substrate and includes a second electrode upper surface facing the same direction as the substrate main surface. The first main surface wiring line contacts the substrate main surface and the first electrode upper surface and includes a first wiring line upper surface facing the same direction as the substrate main surface. The second main surface wiring line contacts the second electrode upper surface and includes a second wiring line upper surface facing the same direction as the substrate main surface. The first wiring line electrode is formed on the first wiring line upper surface. The second wiring line electrode is formed on the second wiring line upper surface. The first joining member joins the first element electrode and the first wiring line electrode. The second joining member joins the second element electrode and the second wiring line electrode. The first electrode upper surface is recessed into the first through-electrode. The second electrode upper surface is recessed into the second through-electrode. The first element electrode is larger than the second element electrode, as viewed in the thickness direction.

Advantageous Effects of Invention

The aspects of the present disclosure provides a semiconductor device that reduces mounting failures of semiconductor elements.

DESCRIPTION OF EMBODIMENTS

Embodiments and modified examples will hereafter be described with reference to the drawings. The embodiments and modified examples described below exemplify configurations and methods for embodying a technical concept and are not intended to limit the material, shape, structure, arrangement, dimensions, and the like of each component to the description. The embodiments and modified examples described below may undergo various modifications. The embodiment and modified examples described below may be combined as long as there is technical consistency.

In this specification, unless otherwise specified, the expression of "A is formed above B" includes a structure in which A is directly on B and a structure in which A is formed above B with an intervening article arranged between A and B. In the same manner, the expression of "state in which member C is arranged between member A and member B" includes a case where members A and C or members B and C are directly connected to each other in addition to a case where members A and C or B and C are indirectly connected to each other through another member that does not affect the electric connection state.

In this specification, "at least one of A and B" should be understood to mean "only A, only B, or both A and B."

Structure of Semiconductor Device

With reference to FIGS. 1 to 23, a semiconductor device 1A in accordance with one embodiment will now be described.

Figure 1:
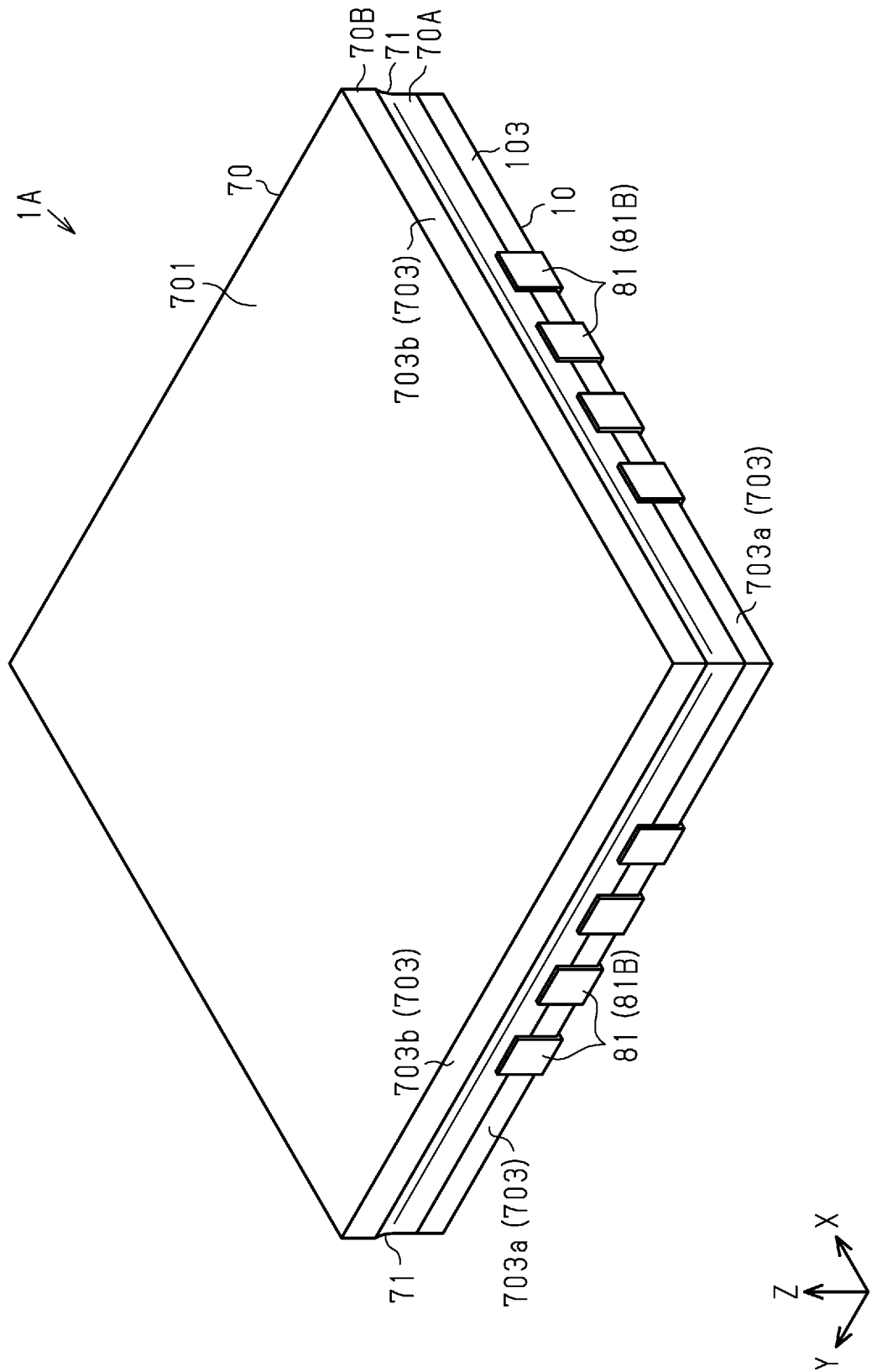
FIG. 1 is an upper perspective view of a semiconductor device in accordance with one embodiment.
Figure 2:
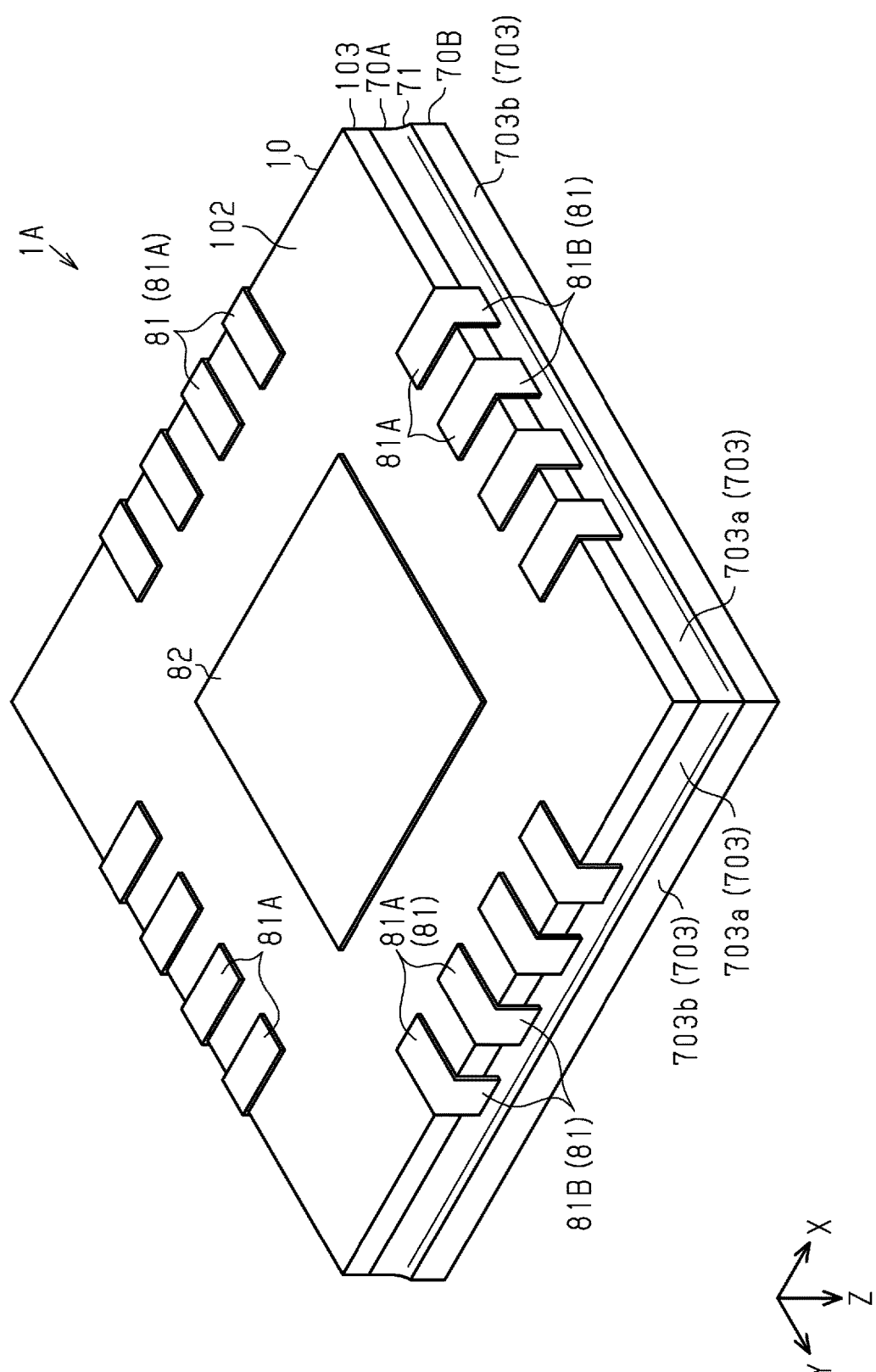
FIG. 2 is a lower perspective view of a semiconductor device in accordance with the embodiment.
Figure 3:
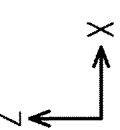
FIG. 3 is a schematic cross-sectional view of the semiconductor device in accordance with the embodiment.
Figure 4:
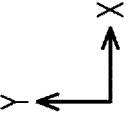
FIG. 4 is a schematic plan view of the semiconductor device in accordance with the embodiment.
Figure 5:
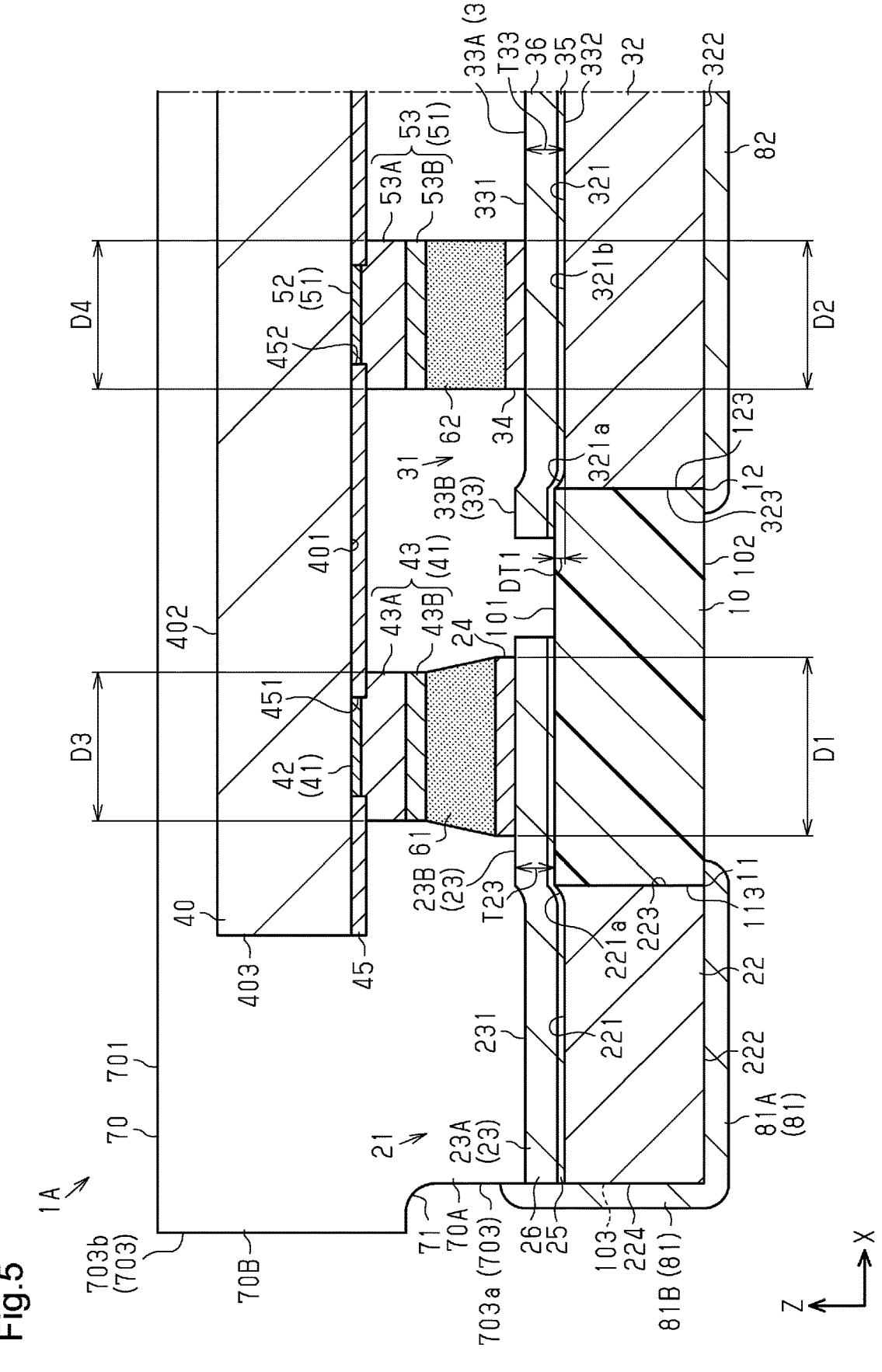
FIG. 5 is an enlarged cross-sectional view showing part of the semiconductor device in accordance with the embodiment.
Figure 16:
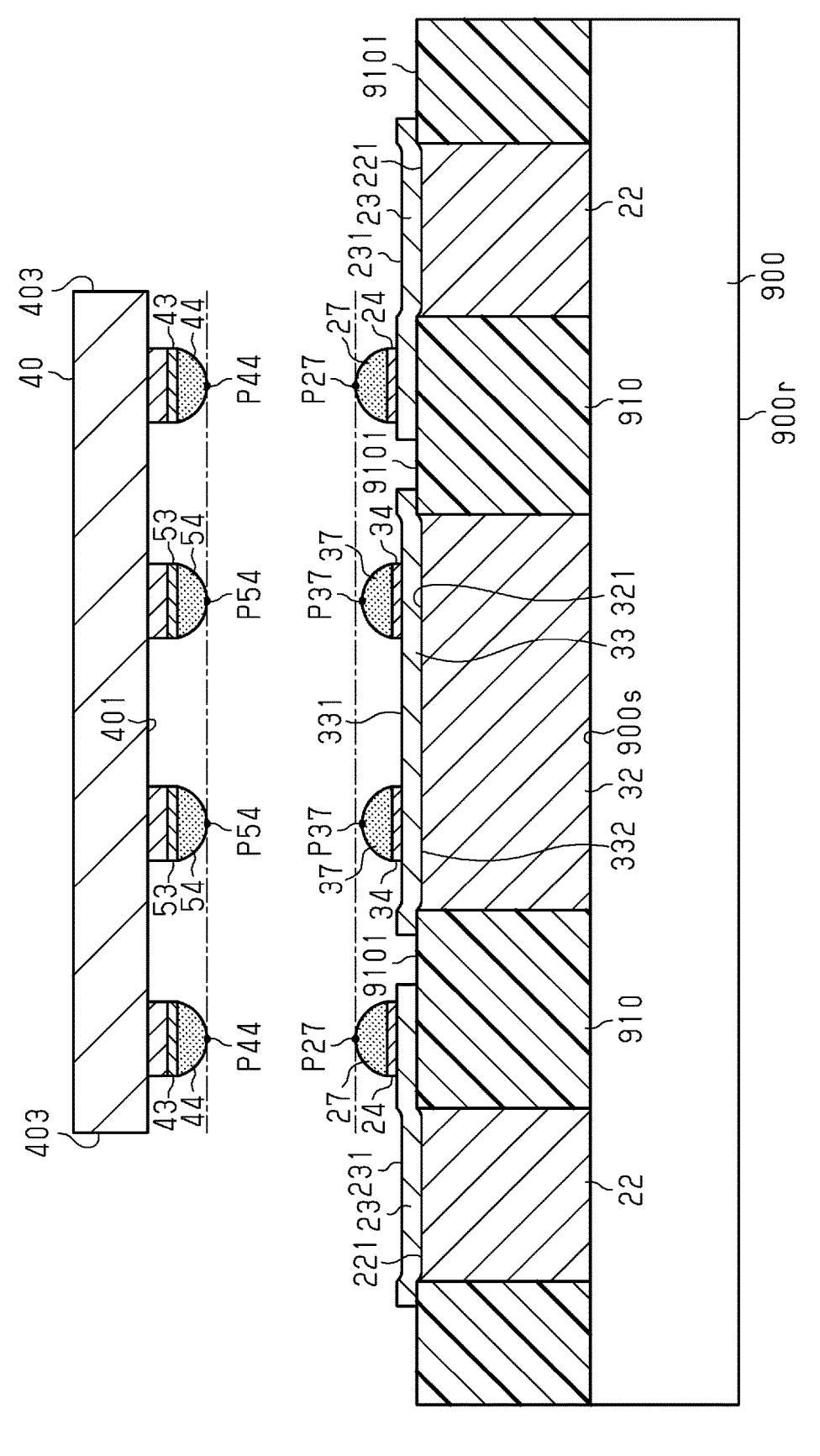
FIG. 16 is a cross-sectional view showing the state of solder layers of a substrate and a semiconductor element in a comparative example.
Figure 17:
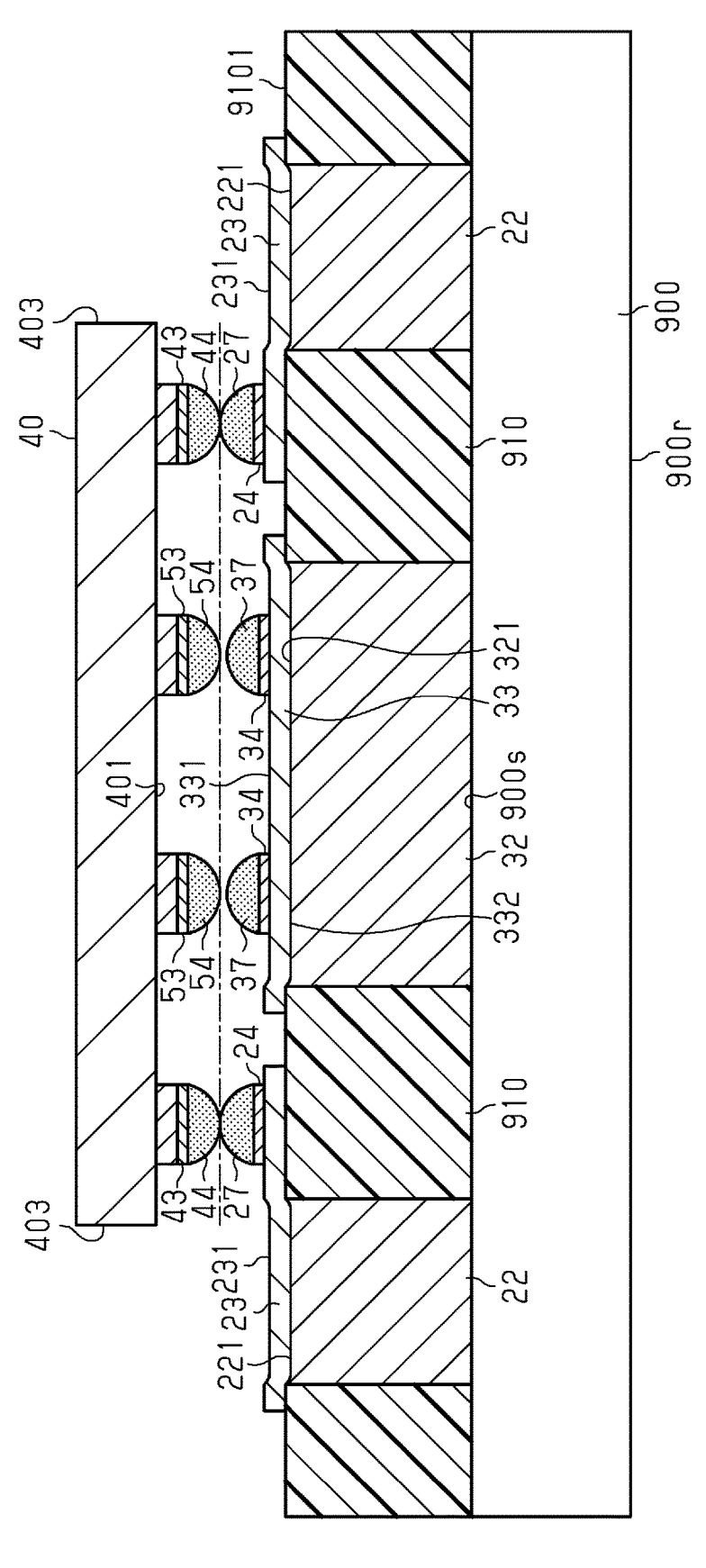
FIG. 17 is a cross-sectional view showing the joined state of the substrate and the semiconductor element in the comparative example.

FIGS. 1 and 2 are perspective views showing the exterior of the semiconductor device 1A. FIG. 1 is an upper perspective view of the semiconductor device 1A, and FIG. 2 is a lower perspective view of the semiconductor device 1A. FIG. 3 is a cross-sectional view of the semiconductor device 1A. FIG. 4 is a schematic plan view showing the lower side of the semiconductor device 1A. FIG. 5 is an enlarged cross-sectional view showing part of the semiconductor device 1A. FIGS. 6 to 15 and 18 to 23 are cross-sectional views illustrating one example of a semiconductor device manufacturing process. FIGS. 16 and 17 are cross-sectional views illustrating one step in a semiconductor device manufacturing process of an example compared with the semiconductor device 1A in accordance with the embodiment.

The semiconductor device 1A is surface-mounted on a circuit board for various types of electronic devices. For the sake of convenience, the thickness direction of the semiconductor device 1A will be referred to as the thickness direction Z. A direction that is parallel to one side of the semiconductor device 1A (sideward direction in plan view) and orthogonal to the thickness direction Z will be referred to as the first direction X. Further, a direction that is orthogonal to both the thickness direction Z of the semiconductor device 1A and the first direction X will be referred to as the second direction Y (upper-lower direction in plan view).

As shown in FIGS. 1 and 2, the semiconductor device 1A has the form of a quadrangular plate. The semiconductor device 1A includes a substrate 10, an encapsulation resin 70, a first external conductive film 81, and a second external conductive film 82. As shown in FIGS. 3 to 5, the semiconductor device 1A includes first wiring portions 21, a second wiring portion 31, a semiconductor element 40, first joining members 61, and second joining members 62. The semiconductor element 40 is connected by the first joining member 61 and the second joining member 62 to the first wiring portions 21 and the second wiring portion 31.

As shown in FIG. 3, the substrate 10 is a support member that serves as the foundation of the semiconductor device 1A. The semiconductor element 40 is mounted on the substrate 10. As shown in FIG. 4, the substrate 10 is quadrangular, with the side in the first direction X being equal in length to the side in the second direction Y, as viewed in the thickness direction Z. The substrate 10 may be changed in shape and in the length of each side.

The substrate 10 includes a substrate main surface 101, a substrate back surface 102, and the substrate side surfaces 103. The substrate main surface 101 and the substrate back surface 102 are located at opposite sides in the thickness direction Z. The substrate main surface 101 is flat. The substrate back surface 102 is flat. Each substrate side surface 103 intersects the substrate main surface 101 and the substrate back surface 102. The substrate side surface 103 faces either the first direction X or the second direction Y Each substrate side surface 103 is flat. In the present embodiment, each substrate side surface 103 orthogonally intersects the substrate main surface 101 and the substrate back surface 102.

The substrate 10 is formed from, for example, an electrically insulative material. The material may be, for example, a synthetic resin of which the base compound is an epoxy resin or the like. The synthetic resin used in the present embodiment is an epoxy resin including a filler. The filler is formed from, for example, $SiO_2$. The substrate 10 is colored in, for example, black. The surfaces of the substrate 10, namely, the substrate main surface 101, the substrate back surface 102, and the substrate side surface 103, include cutting marks. Further, the filler included in the material of the substrate 10 is exposed from the surfaces of the substrate 10, namely, the substrate main surface 101, the substrate back surface 102, and the substrate side surface 103.

The substrate 10 includes first through holes 11 that extend through the substrate 10 in the thickness direction Z from the substrate main surface 101 to the substrate back surface 102. As shown in FIG. 4, in the present embodiment, the substrate 10 includes four first through holes 11 along each side of the substrate 10. Each first through hole 11 is, for example, quadrangular, as viewed in the thickness direction Z. The first through hole 11 may be shaped to be circular or polygonal. Each first through hole 11 extends to the corresponding substrate side surface 103. Thus, each first through hole 11 opens in the substrate side surface 103.

The substrate 10 includes a second through hole 12 that extends through the substrate 10 in the thickness direction Z from the substrate main surface 101 to the substrate back surface 102. As shown in FIGS. 3 and 4, the second through hole 12 is formed in the central part of the substrate 10. The second through hole 12 is formed at a position overlapping the semiconductor element 40, as viewed in the thickness direction Z. The second through hole 12 is quadrangular, as viewed in the thickness direction Z.

As shown in FIGS. 3 to 5, the semiconductor device 1A of the present embodiment includes the first wiring portions 21 and the second wiring portion 31. As shown in FIGS. 3 and 4, each first wiring portion 21 of the present embodiment extends in the thickness direction Z from a portion overlapping the semiconductor element 40 to the corresponding substrate side surface 103 of the substrate 10. The second wiring portion 31 of the present embodiment overlaps the semiconductor element 40 in the thickness direction Z.

Each first wiring portion 21 includes a first through-electrode 22, a first main surface wiring line 23, and a first wiring line electrode 24.

The first through-electrode 22 is disposed in a corresponding one of the first through holes 11. As shown in FIG. 5, the first through-electrode 22 includes an upper surface 221, a lower surface 222, and side surfaces 223 and 224. The upper surface 221 and the lower surface 222 are located at opposite sides in the thickness direction Z. The side surfaces 223 and 224 intersect the upper surface 221 and the lower surface 222.

The upper surface 221 of the first through-electrode 22 is recessed into the first through-electrode 22. As shown in FIG. 5, the upper surface 221 includes a peripheral portion, adjacent to a wall surface 113 of the first through hole 11, and an inner portion, extending from the peripheral portion toward the central part of the upper surface 221. The inner portion is a generally flat surface. The inner portion extends to the substrate side surface 103 of the substrate 10. The peripheral portion is recessed into the first through-electrode 22 from the substrate main surface 101 so that the substrate back surface 102 becomes closer as the wall surface 113 of the first through hole 11 becomes farther. The upper surface 221 may be formed to be entirely flat, that is, so that the upper surface 221 extends from the inner portion to the peripheral portion 221a at the same position in the thickness direction Z. The depth of the upper surface 221 of the first through-electrode 22 from the substrate main surface 101 is, for example, 1 μm.

The lower surface 222 of the first through-electrode 22 is flush with the substrate back surface 102 of the substrate 10. The lower surface 222 is an exposed surface exposed from the substrate back surface 102 of the substrate 10. The lower surface 222 of the first through-electrode 22 does not have to be flush with the substrate back surface 102 of the substrate 10. The side surface 223 of the first through-electrode 22 contacts the wall surface 113 of the first through hole 11. The side surface 224 of the first through-electrode 22 is exposed from the substrate side surface 103 of the substrate 10. The first through-electrode 22 is formed from an electrically conductive material. The material of the first through-electrode 22 may be copper (Cu), a Cu alloy, or the like.

The first main surface wiring line 23 extends from the upper surface 221 of the first through-electrode 22 to the substrate main surface 101 of the substrate 10. In detail, as shown in FIGS. 3 to 5, the first main surface wiring line 23 extends to the substrate main surface 101 that overlaps the semiconductor element 40, as viewed in the thickness direction Z. The first main surface wiring line 23 includes a connected wiring line portion 23A, connected to the upper surface 221 of the first through-electrode 22, and a substrate wiring line portion 23B, connected to the substrate main surface 101 of the substrate 10.

The first main surface wiring line 23 is formed from an electrically conductive material and electrically connected to the first through-electrode 22. The first main surface wiring line 23 includes an upper surface 231, a lower surface 232, and side surfaces 233 and 234. The upper surface 231 and the lower surface 232 are located at opposite sides in the thickness direction Z. The side surfaces 233 and 234 face a direction orthogonal to the thickness direction Z. The upper surface 231 of the first main surface wiring line 23 faces the same direction as the substrate main surface 101 of the substrate 10. The lower surface 232 of the first main surface wiring line 23 faces the same direction as the substrate back surface 102 of the substrate 10. Part of the lower surface 232 contacts the substrate main surface 101 of the substrate 10, and another part of the lower surface 232 is connected to the upper surface 221 of the first through-electrode 22. The side surface 233 contacts the encapsulation resin 70. In FIG. 5, the side surface 234 facing the first direction X is an exposed side surface exposed from a resin side surface 703 of the encapsulation resin 70. The first main surface wiring line 23 has a thickness of, for example, 5 μm or greater and 30 μm or less.

As shown in FIG. 5, the first main surface wiring line 23 includes a metal layer 25 and a conductive layer 26. The metal layer 25 and the conductive layer 26 are formed in this order on the substrate main surface 101 of the substrate 10. The metal layer 25 includes a first layer and a second layer. The first layer, of which the main component is, for example, titanium (Ti), contacts the substrate main surface 101 of the substrate 10 and the upper surface 221 of the first through-electrode 22. The second layer, of which the main component is Cu, contacts the first layer. The metal layer 25 serves as a seed layer used to form the conductive layer 26. The main component of the conductive layer 26 is, for example, Cu.

As shown in FIGS. 3 and 5, the first wiring line electrode 24 is formed on the upper surface 231 of the first main surface wiring line 23. The first main surface wiring line 23 includes the connected wiring line portion 23A, connected to the first through-electrode 22, and the substrate wiring line portion 23B, connected to the substrate main surface 101. The first wiring line electrode 24 is formed on the upper surface 231 of the substrate wiring line portion 23B.

As shown in FIGS. 3 and 4, the first wiring line electrode 24 is formed in a region overlapping the semiconductor element 40 in the thickness direction Z. Further, the first wiring line electrode 24 is formed on a portion of the first main surface wiring line 23 overlapping the substrate main surface 101 of the substrate 10 in the thickness direction Z. As shown in FIG. 4, the first wiring line electrode 24 is circular, as viewed in the thickness direction Z. The first wiring line electrode 24 is formed from, for example, Ni.

The second wiring portion 31 is disposed in the second through hole 12, which overlaps the semiconductor element 40 as viewed in the thickness direction Z. That is, the second wiring portion 31 extends through the substrate 10. The second wiring portion 31 is used, for example, to dissipate heat of the semiconductor element 40. The second wiring portion 31 releases the heat generated by the semiconductor element 40 toward the substrate back surface 102 of the substrate 10.

As shown in FIG. 4, the second wiring portion 31 is arranged overlapping the central part of the semiconductor element 40. The substrate 10 includes the second through hole 12 that overlaps the central part of the semiconductor element 40. The position where the second wiring portion 31 is arranged may be changed. For example, the second through hole 12, or the second wiring portion 31, is preferably arranged so that the second through hole 12 and the second wiring portion 31 overlap a region of the semiconductor element 40 including the portion where the temperature becomes the highest. For example, in the semiconductor element 40, the portion where a power resistor is formed is where a large amount of heat is generated. In this manner, it is preferred that the second through hole 12 and the second wiring portion 31 overlap a region including an element portion where a large amount of heat is generated in the semiconductor element 40.

As shown in FIG. 3, the second wiring portion 31 includes a second through-electrode 32, a second main surface wiring line 33, and second wiring line electrodes 34. The second through-electrode 32 is disposed in the second through hole 12. The second through-electrode 32 includes an upper surface 321, a lower surface 322, and side surfaces 323. The upper surface 321 and the lower surface 322 are located at opposite sides in the thickness direction Z. The side surfaces 323 intersect the upper surface 321 and the lower surface 322 in the thickness direction Z.

The upper surface 321 of the second through-electrode 32 is recessed into the second through-electrode 32. As shown in FIG. 5, the upper surface 321 includes a peripheral portion 321a, adjacent to a wall surface 123 of the second through hole 12, and an inner portion 321b, extending from the peripheral portion 321a toward the central part of the upper surface 321. The inner portion 321b is a generally flat surface. The peripheral portion 321a is recessed into the second through-electrode 32 from the substrate main surface 101 so that the substrate back surface 102 becomes closer as the wall surface 123 of the second through hole 12 becomes farther. The upper surface 321 may be formed to be entirely flat, that is, so that the upper surface 321 extends from the inner portion 321b to the peripheral portion 321a over the same position in the thickness direction Z. The depth of the upper surface 321 of the second through-electrode 32 from the substrate main surface 101 is, for example, 1 μm.

The lower surface 322 of the second through-electrode 32 is flush with the substrate back surface 102 of the substrate 10. The lower surface 322 is an exposed surface exposed from the substrate back surface 102 of the substrate 10. The lower surface 322 of the second through-electrode 32 does not have to be flush with the substrate back surface 102 of the substrate 10. The side surfaces 323 of the second through-electrode 32 contact the wall surface 123 of the second through hole 12. The second through-electrode 32 is formed from an electrically conductive material. The second through-electrode 32 is formed from, for example, a plating metal. The second through-electrode 32 is formed from, for example, the same material as the first through-electrode 22. The material of the second through-electrode 32 may be, for example, Cu, a Cu alloy, or the like.

The second main surface wiring line 33 is connected to the upper surface 321 of the second through-electrode 32. The second main surface wiring line 33 is quadrangular, as viewed in the thickness direction Z. The second main surface wiring line 33 includes an upper surface 331, a lower surface 332, and side surfaces 333. The upper surface 331 and the lower surface 332 are located at opposite sides in the thickness direction Z. The side surfaces 333 intersect the upper surface 331 and the lower surface 332. The upper surface 331 of the second main surface wiring line 33 faces the same direction as the upper surface 321 of the second through-electrode 32. The lower surface 332 of the second main surface wiring line 33 faces the upper surface 321 of the second through-electrode 32 and contacts the upper surface 321.

The second main surface wiring line 33 and the first main surface wiring line 23 have the same thickness. The second main surface wiring line 33 is larger than the second through-electrode 32, as viewed in the thickness direction Z. The second main surface wiring line 33 includes a connected wiring line portion 33A, connected to the upper surface 321 of the second through-electrode 32, and an extension 33B, extending outward from the side surfaces 323 of the second through-electrode 32. The extension 33B does not overlap the second through-electrode 32 in the thickness direction Z. In the present embodiment, the extension 33B has a closed shape. The lower surface 332 of the extension 33B contacts the substrate main surface 101.

As shown in FIG. 5, the second main surface wiring line 33 includes a metal layer 35 and a conductive layer 36. The metal layer 35 and the conductive layer 36 are formed in this order on the upper surface 321 of the second through-electrode 32. The metal layer 35 includes a first layer, which contacts the upper surface 321 of the second through-electrode 32, and a second layer, which contacts the first layer. The main component of the first layer is, for example, Ti, and the main component of the second layer is, for example, Cu. The metal layer 35 serves as a seed layer used to form the conductive layer 36. The main component of the conductive layer 36 is, for example, Cu. The second main surface wiring line 33 and the first main surface wiring line 23 have the same structure. The second main surface wiring line 33 and the first main surface wiring line 23 are formed at the same time.

As shown in FIG. 3, the second wiring line electrodes 34 are formed on the upper surface 331 of the second main surface wiring line 33. As shown in FIG. 4, the semiconductor device 1A of the present embodiment includes two second wiring line electrodes 34. There may be one second wiring line electrode 34. Alternatively, there may be three or more second wiring line electrodes 34. As shown in FIGS. 3 and 4, the second wiring line electrodes 34 are formed in a region overlapping the semiconductor element 40 in the thickness direction Z. As shown in FIG. 3, the second wiring line electrodes 34 are formed on the upper surface 331 of the second main surface wiring line 33 overlapping the second through-electrode 32 in the thickness direction Z. That is, the second wiring line electrodes 34 are formed on the upper surface 331 of the connected wiring line portion 33A, which is where the second main surface wiring line 33 is connected to the upper surface 321 of the second through-electrode 32.

As shown in FIG. 4, the second wiring line electrodes 34 are circular, as viewed in the thickness direction Z. The second wiring line electrodes 34 have the same thickness as the first wiring line electrode 24. The first wiring line electrode 24 and the second wiring line electrodes 34 are formed in, for example, the same step. The second wiring line electrodes 34 are formed from, for example, Ni.

As shown in FIGS. 3 to 5, the first wiring line electrodes 24 differ from the second wiring line electrodes 34 in size, as viewed in the thickness direction Z. In the present embodiment, the first wiring line electrodes 24 are larger than the second wiring line electrodes 34. As shown in FIG. 5, when the first wiring line electrodes 24 each have diameter denoted by D1 and the second wiring line electrodes 34 each have a diameter denoted by D2, the diameter D2 of the second wiring line electrodes 34 is smaller than the diameter D1 of the first wiring line electrodes 24.

As shown in FIG. 4, the semiconductor element 40 is quadrangular, as viewed in the thickness direction Z. As shown in FIGS. 3 and 4, the semiconductor element 40 includes an element main surface 401, an element back surface 402, and element side surfaces 403. The element main surface 401 and the element back surface 402 are located at opposite sides in the thickness direction Z. The element side surfaces 403 face directions orthogonal to the thickness direction Z. The element side surfaces 403 intersect the element main surface 401 and the element back surface 402. The element main surface 401 faces the substrate main surface 101 of the substrate 10. The element back surface 402 faces the same direction as the substrate main surface 101 of the substrate 10.

The semiconductor element 40 is, for example, an integrated circuit (IC) such as a large-scale integration (LSI) circuit. Further, the semiconductor element 40 is a voltage-regulating element such as a low-dropout (LDO), an amplification element such as an operational amplifier, or a discrete semiconductor element such as a diode or a sensor. For example, in an LSI, the element main surface 401 is where members imparting functionality to the semiconductor element 40 are formed. The semiconductor element 40 does not have to be formed by more than one member and may be an element formed by a single member, such as a chip capacitor or a chip inductor, or an element formed from a base material other than a semiconductor. In the present embodiment, the semiconductor element 40 is an LSI.

The element main surface 401 of the semiconductor element 40 includes first connection pads 41 and second connection pads 51 that are used for mounting. As shown in FIG. 4, the first connection pads 41 are disposed along the element side surfaces 403. The second connection pads 51 are disposed at the inner side of the first connection pads 41. The first connection pads 41 are input-output terminals for signals or the like related to the operation of the semiconductor element 40. The second connection pads 51 are, for example, terminals that do not affect the electrical characteristics of the semiconductor element 40. The terminals may be ground terminals, terminals insulated from the first connection pads 41, or the like.

As shown in FIG. 3, the semiconductor element 40 is disposed with the element main surface 401 facing the substrate main surface 101 of the substrate 10. The first connection pads 41 of the semiconductor element 40 are disposed facing the first wiring line electrodes 24 on the upper surfaces 231 of the first main surface wiring lines 23. The second connection pads 51 of the semiconductor element 40 are disposed facing the second wiring line electrodes 34 on the upper surface 331 of the second main surface wiring line 33. The first connection pads 41 are connected by the first joining members 61 to the first wiring line electrodes 24. The second connection pads 51 are connected by the second joining members 62 to the second wiring line electrodes 34. In this manner, the semiconductor element 40 is flip-chip-mounted with the element main surface 401 facing the substrate main surface 101 of the substrate 10. Thus, the element main surface 401 may be referred to as an element-mounting surface used for mounting of the semiconductor element 40.

As shown in FIG. 5, each first connection pad 41 includes a first electrode pad 42 and a first element electrode 43. The first electrode pad 42 is exposed from openings 451 and 452 in a protective film 45 that covers the element main surface 401 of the semiconductor element 40. The first electrode pad 42 is formed from, for example, aluminum (Al). The first element electrode 43 is connected to the first electrode pad 42. The first element electrode 43 includes a conductive layer 43A and a barrier layer 43B. The conductive layer 43A is formed from, for example, Cu or a CU alloy. The conductive layer 43A may include a seed layer. The seed layer is formed from, for example, Ti/Cu. The barrier layer 43B is formed from Ni, an alloy including Ni, or metal layers including Ni. The barrier layer 43B may be formed from, for example, Ni, Pd, Au, or an alloy including two or more of these metals. The protective film 45 is formed from, for example, a polyimide resin.

The second connection pads 51 have the same structure as the first connection pads 41. More specifically, each second connection pad 51 includes a second electrode pad 52 and a second element electrode 53. The second electrode pad 52 is exposed from an opening in the protective film 45, which covers the element main surface 401 of the semiconductor element 40. The second electrode pad 52 is formed from, for example, Al. The second element electrode 53 is connected to the second electrode pad 52. The second element electrode 53 includes a conductive layer 53A and a barrier layer 53B. The conductive layer 53A is formed from, for example, Cu or a CU alloy. The conductive layer 53A may include a seed layer. The seed layer is formed from, for example, Ti/Cu. The barrier layer 53B is formed from Ni, an alloy including Ni, or metal layers including Ni. The barrier layer 53B may be formed from, for example, Ni, Pd, Au, or an alloy including two or more of these metals.

The first element electrodes 43 are, for example, circular, as viewed in the thickness direction. The second element electrodes 53 are, for example, circular, as viewed in the thickness direction. As shown in FIG. 5, diameter D3 of the first element electrodes 43 is equal to diameter D4 of the second element electrodes 53. In the present embodiment, the diameter D1 of the first wiring line electrodes 24 is greater than the diameter D3 of the first element electrodes 43. The diameter D2 of the second wiring line electrodes 34 is equal to the diameter D4 of the second element electrodes 53. The first element electrodes 43 and the second element electrodes 53 may be changed to have any shape, as viewed in the thickness direction, such as a quadrangular shape, a polygonal shape having five or more sides, or an elliptical shape. Further, the first element electrodes 43 may be shaped differently from the second element electrodes 53.

The first joining members 61 and the second joining members 62 are used to join the semiconductor element 40 with the first wiring portions 21 and the second wiring portions 31. The first joining members 61 join the first wiring line electrodes 24 of the first main surface wiring lines 23 with the first element electrodes 43 of the semiconductor element 40. The second joining members 62 join the second wiring line electrodes 34 of the second main surface wiring line 33 with the second element electrodes 53 of the semiconductor element 40.

As shown in FIG. 5, each first joining member 61 has a cross section extending in the thickness direction Z, or a cross section orthogonal to the substrate main surface 101, that is generally trapezoidal. Each second joining member 62 has a cross section orthogonal to the substrate main surface 101 that generally has the shape of a rectangle (shape of parallelogram). The first joining members 61 and the second joining members 62 are formed from Sn or an alloy including Sn. The alloy is, for example, a Sn—Ag (silver) alloy, Sn—Sb (antimony) alloy, or the like.

As shown in FIG. 3, the encapsulation resin 70 contacts the substrate main surface 101 of the substrate 10 and covers the semiconductor element 40. The gap between the substrate 10 and the semiconductor element 40 is filled with the encapsulation resin 70. Thus, the encapsulation resin 70 covers the substrate main surface 101 of the substrate 10, the first wiring portions 21, and the second wiring portion 31. The encapsulation resin 70 also covers the element main surface 401 of the semiconductor element 40, the element side surfaces 403, and the element back surface 402. Further, the encapsulation resin 70 covers the first joining members 61 and the second joining members 62 that join the semiconductor element 40 with the first wiring portions 21 and the second wiring portion 31.

The encapsulation resin 70 overlaps the substrate 10, as viewed in the thickness direction Z. The encapsulation resin 70 includes a resin upper surface 701, facing the same direction as the substrate main surface 101 of the substrate 10, and the resin side surfaces 703, which face the same direction as the corresponding substrate side surfaces 103.

The encapsulation resin 70 includes a first resin portion 70A, which is located toward the substrate 10 in the thickness direction Z, and a second resin portion 70B, which is located toward the resin upper surface 701. The first resin portion 70A includes a first resin side surface 703a that forms part of the resin side surface 703, and the second resin portion 70B includes a second resin side surface 703b that forms part of the resin side surface 703. As viewed in the thickness direction Z, the first resin portion 70A has the same size as the substrate 10. Further, as viewed in the thickness direction Z, the second resin portion 70B is larger than the first resin portion 70A. The second resin side surface 703b is located outward from the first resin side surface 703a. In this manner, the encapsulation resin 70 includes a step 71, recessed into the encapsulation resin 70, because of the difference in size between the first resin portion 70A and the second resin portion 70B. As shown in FIG. 2, the step 71 extends around the entire encapsulation resin 70.

The encapsulation resin 70 is formed from, for example, an electrically insulative resin. The resin may be, for example, a synthetic resin of which the base component is an epoxy resin or the like. The encapsulation resin 70 has, for example, a black color. The encapsulation resin 70 is not limited in material and shape.

The first external conductive film 81 includes a first conductive film 81A and a second conductive film 81B. The first conductive film 81A covers the lower surface 222 of the first through-electrode 22. The second conductive film 81B covers the side surface 224 of each first through-electrode 22 and the side surface 234 of each first main surface wiring line 23. The first external conductive film 81, which includes the first conductive film 81A and the second conductive film 81B, serves as the external connection terminal of the semiconductor device 1A. The first external conductive film 81 is formed by, for example, a stack of metal layers. The metal layers are, for example, a Ni layer and a Au layer. The first external conductive film 81 is not limited in material and may be, for example, formed from Sn or formed by a stack of a Ni layer, a Pd layer, and a Au layer.

When mounting the semiconductor device 1A on a circuit board, solder for connecting the first external conductive film 81 to connection pads of the circuit board is applied between the first conductive film 81A and the connection pads and also to the second conductive film 81B. More specifically, solder that is in a liquid phase during a reflow process moves onto the second conductive film 81B and forms a fillet between the second conductive film 81B and the connection pads. In this manner, the semiconductor device 1A further facilitates the formation of a solder fillet. The solder fillet enlarges the solder joining area and further increases the connection strength. Further, the solder fillet allows the soldered state of the semiconductor device 1A to be checked from the outer side.

The second external conductive film 82 covers the lower surface 322 of the second through-electrode 32, which is exposed from the substrate 10. The second external conductive film 82 serves as a terminal for dissipating heat out of the semiconductor device 1A. The second external conductive film 82 is formed from, for example, the same material as the first external conductive film 81. The second external conductive film 82 is formed by, for example, a stack of metal layers. The metal layers are, for example, a Ni layer and a Au layer. The second external conductive film 82 is not limited in material and may be, for example, formed from Sn or formed by a stack of a Ni layer, a Pd layer, and a Au layer.

Manufacturing Process of Semiconductor Device

With reference to FIGS. 6 to 14 and 17 to 23, one example of a method for manufacturing the semiconductor device 1A according to the present embodiment of the present disclosure will now be described. The drawings that are referred to show an area where a single semiconductor device 1A is formed. The directions indicated in these drawings are defined in the same manner as the directions indicated in FIGS. 1 to 5.

Figure 6:
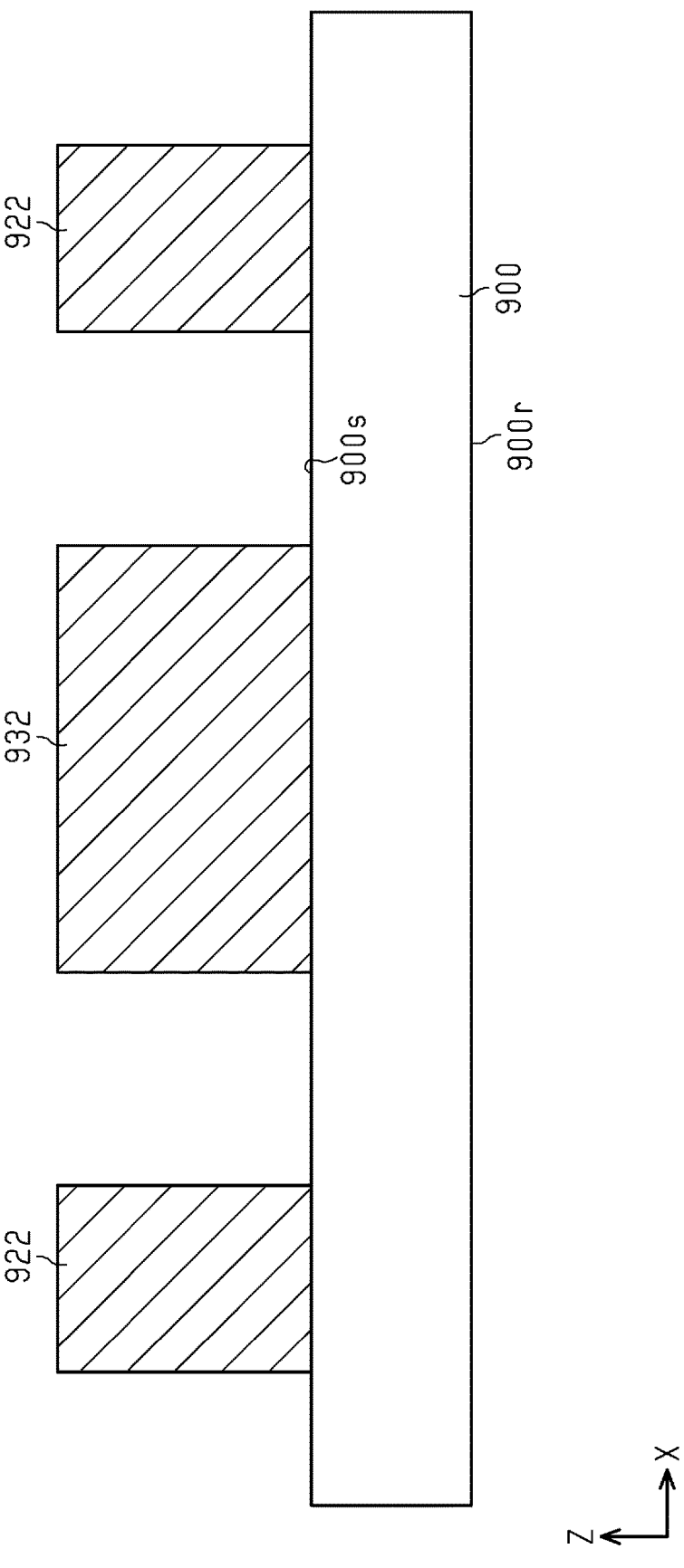
FIG. 6 is a schematic cross-sectional view illustrating a manufacturing step of the semiconductor device in accordance with the embodiment.

As shown in FIG. 6, the method for manufacturing the semiconductor device 1A includes a step of preparing a support substrate 900. The support substrate 900 is formed from, for example, a monocrystalline material of Si. The support substrate 900 includes a main surface 900s and a lower surface 900r located at opposite sides in the thickness direction Z. The support substrate 900 may be formed from a synthetic resin material such as an epoxy resin.

Then, terminal pillars 922 and 932 are formed on the main surface 900s of the support substrate 900. The terminal pillars 922 and 932 are formed from, for example, Cu or an alloy of which the main component is Cu. The terminal pillars 922 and 932 are formed through an electrolytic plating process. The terminal pillars 922 become the first through-electrodes 22 in the semiconductor device 1A described above, and the terminal pillar 932 becomes the second through-electrode 32 in the semiconductor device 1A described above.

The terminal pillars 922 and 932 are formed through, for example, a step of forming a seed layer, a step of forming a mask through photolithography on the seed layer, and a step of forming a plating layer that contacts the seed layer. The seed layer may be formed on the main surface 900s of the support substrate 900 through, for example, a sputtering process. The seed layer is covered by, for example, a photosensitive resist layer. Further, the resist layer undergoes exposure and development to form a mask including openings. Then, an electrolytic plating process is performed using the seed layer as a conductive path to deposit plating metal on the surface of the seed layer exposed from the mask. This forms the terminal pillars 922 and 932. The mask is removed after the formation of the terminal pillars 922 and 932. Alternatively, the terminal pillars 922 and 932 may be formed by rods of Cu.

Figure 7:
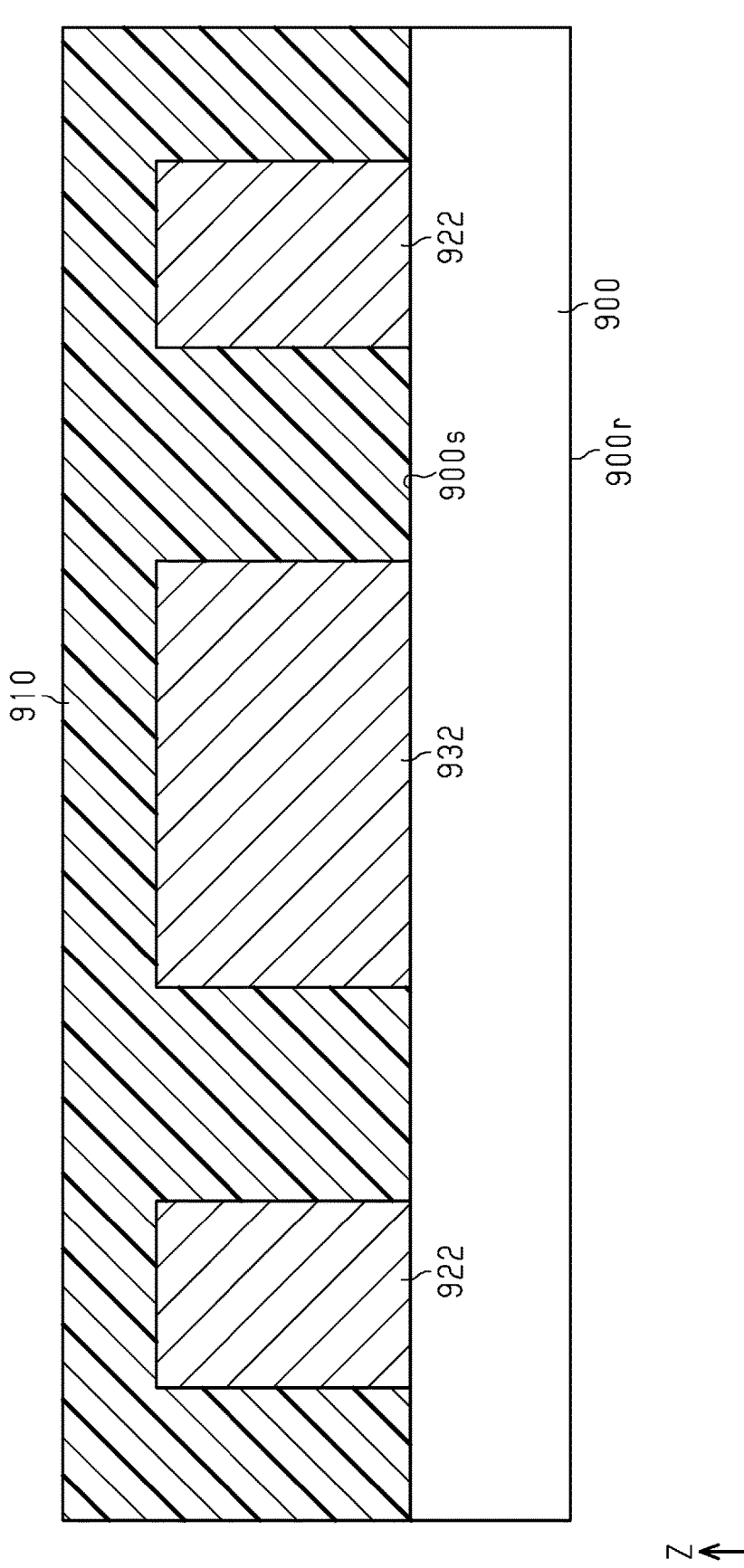
FIG. 7 is a schematic cross-sectional view illustrating a manufacturing step of the semiconductor device in accordance with the embodiment.

As shown in FIG. 7, the method for manufacturing the semiconductor device 1A includes a step of forming a base material 910 that contacts the main surface 900s of the support substrate 900 and covers the terminal pillars 922 and 932. The base material 910 covers the upper surfaces and side surfaces of the terminal pillars 922 and 932. The base material 910 may be formed from the material of the substrate 10 shown in FIGS. 1 to 3 and 5. In the present embodiment, the material of the base material 910 may be a synthetic resin of which the base compound is an epoxy resin or the like.

Figure 8:
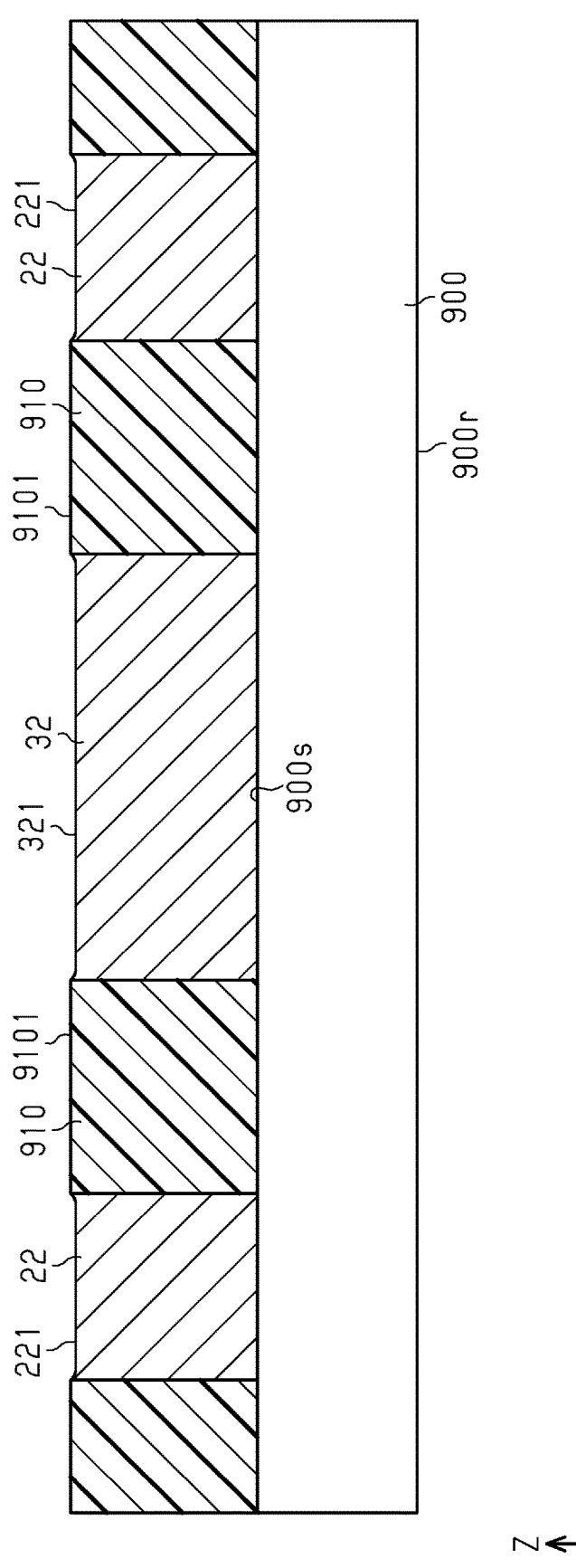
FIG. 8 is a schematic cross-sectional view illustrating a manufacturing step of the semiconductor device in accordance with the embodiment.

As shown in FIG. 8, the method for manufacturing the semiconductor device 1A includes a step of forming the first through-electrodes 22 and the second through-electrodes 32 by grinding parts of the base material 910 and the terminal pillars 922 and 932. The base material 910 is ground so that the base material 910 has a greater thickness than the substrate 10 shown in FIGS. 3 and 5. The grinding exposes the upper surfaces 221 and 321 of the first through-electrodes 22 and the second through-electrode 32 from a material main surface 9101 of the base material 910. Then, etching, for example wet etching, is performed to remove burrs of the terminal pillars 922 and 932 produced during grinding from the material main surface 9101 of the base material 910. The etching results in the upper surfaces 221 and 321 of the first through-electrodes 22 and the second through-electrode 32 being recessed from the material main surface 9101 of the base material 910 into the first through-electrodes 22 and the second through-electrode 32.

Figure 9:
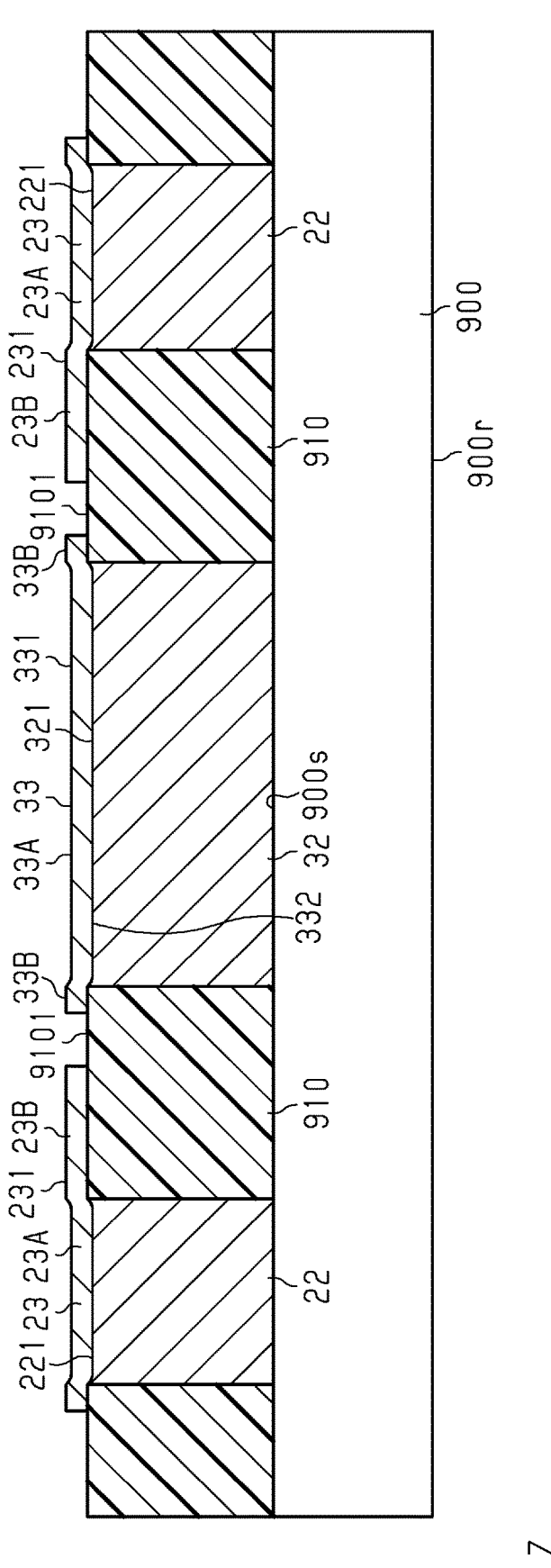
FIG. 9 is a schematic cross-sectional view illustrating a manufacturing step of the semiconductor device in accordance with the embodiment.

As shown in FIG. 9, the method for manufacturing the semiconductor device 1A includes a step of forming the first main surface wiring lines 23 and the second main surface wiring line 33.

The step of forming the first main surface wiring lines 23 and the second main surface wiring line includes a step of forming a seed layer and a step of forming a conductive layer. The seed layer forms, for example, the metal layer 25 of each first main surface wiring line 23 and the metal layer 35 of the second main surface wiring line 33 shown in FIG. 5. The conductive layer forms, for example, the conductive layer 26 of each first main surface wiring line 23 and the conductive layer 36 of the second main surface wiring line 33 shown in FIG. 5.

The seed layer that becomes the metal layers 25 and 35 is formed through, for example, a sputtering process. The seed layer, for example, includes a first layer, of which the main component is Ti, and a second layer, of which the main component is Cu. The seed layer covers the material main surface 9101 of the base material 910 and the upper surfaces 221 and 321 of the first through-electrodes 22 and the second through-electrode 32. Then, a mask including openings is formed through, for example, photolithography using a photosensitive resist layer. Further, an electrolytic plating process is performed using, for example, the seed layer as a conductive path to deposit plating metal on the surface of the seed layer exposed from the mask and form the conductive layers. The seed layer is removed when appropriate.

Figure 10:
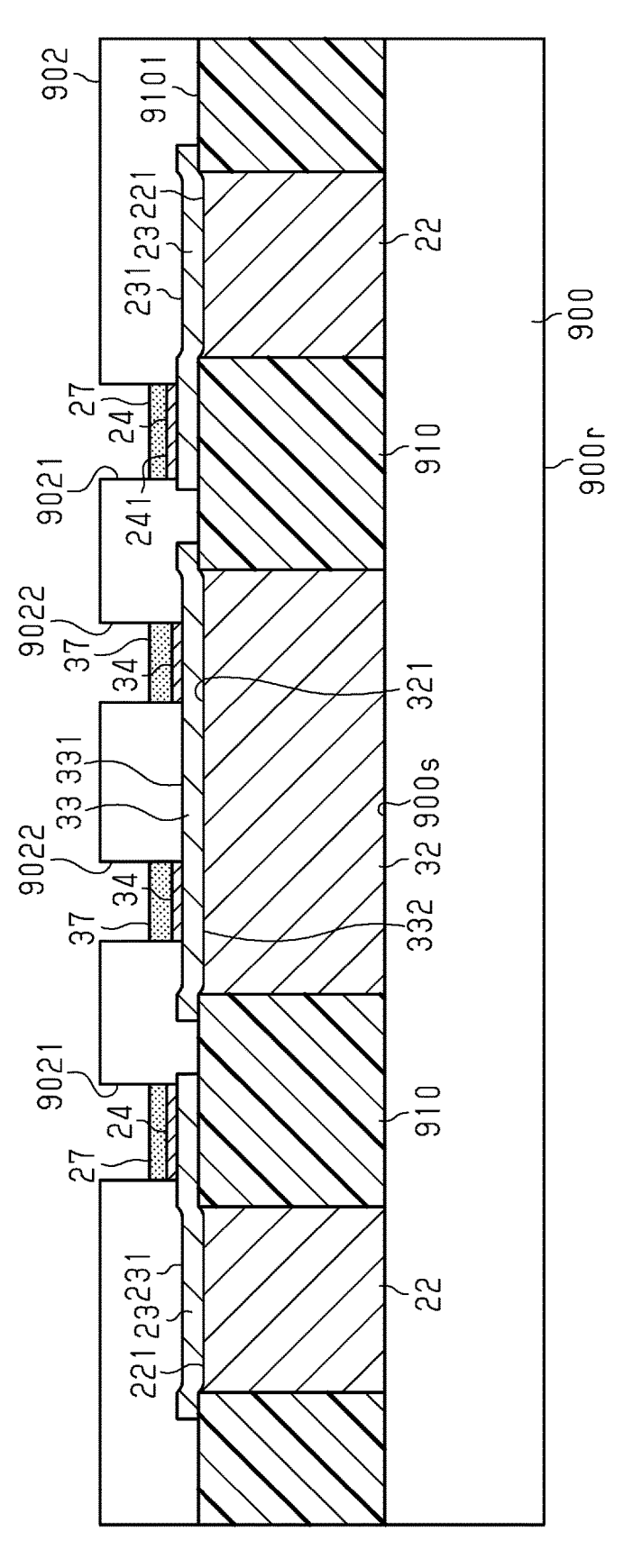
FIG. 10 is a schematic cross-sectional view illustrating a manufacturing step of the semiconductor device in accordance with the embodiment.

As shown in FIG. 10, the method for manufacturing the semiconductor device 1A includes a step of forming the first wiring line electrodes 24, the second wiring line electrodes 34, a first substrate solder layer 27, and a second substrate solder layer 37. The first wiring line electrodes 24 and the second wiring line electrodes 34 are formed through, for example, an electrolytic plating process. A mask 902 is formed on the material main surface 9101 of the base material 910. The mask 902 is formed through, for example, photolithography using a photosensitive resist layer. The mask 902 includes openings 9021, which partially expose the upper surface 231 of each first main surface wiring line 23, and openings 9022, which partially expose the upper surface 331 of the second main surface wiring line 33. The openings 9021, which are used to form the first wiring line electrodes 24, are larger than the openings 9022, which are used to form the second wiring line electrodes 34. Further, Ni is deposited on the upper surface 231 of each first main surface wiring line 23 and the upper surface 331 of the second main surface wiring line 33 to form the first wiring line electrodes 24 and the second wiring line electrodes 34.

Then, the first substrate solder layer 27 is formed on the first wiring line electrodes 24, and the second substrate solder layer 37 is formed on the second wiring line electrodes 34. The first substrate solder layer 27 and the second substrate solder layer 37 form parts of the first joining members 61 and the second joining members 62 shown in FIGS. 3 and 5. The first substrate solder layer 27 and the second substrate solder layer 37 are formed through, for example, an electrolytic plating process.

The first substrate solder layer 27 is formed by depositing a plating metal of an alloy including Sn and Ag on the first wiring line electrodes 24. The second substrate solder layer 37 is formed by depositing a plating metal of an alloy including Sn and Ag on the second wiring line electrodes 34. In this step, a difference in current density is produced during electrolytic plating in accordance with the diameters of the openings 9021 and 9022 in the mask 902. This results in the second wiring line electrodes 34 and the second substrate solder layer 37 that are formed in the openings 9022 having a greater height than the first wiring line electrodes 24 and the first substrate solder layer 27 that are formed in the openings 9021.

Figure 11:
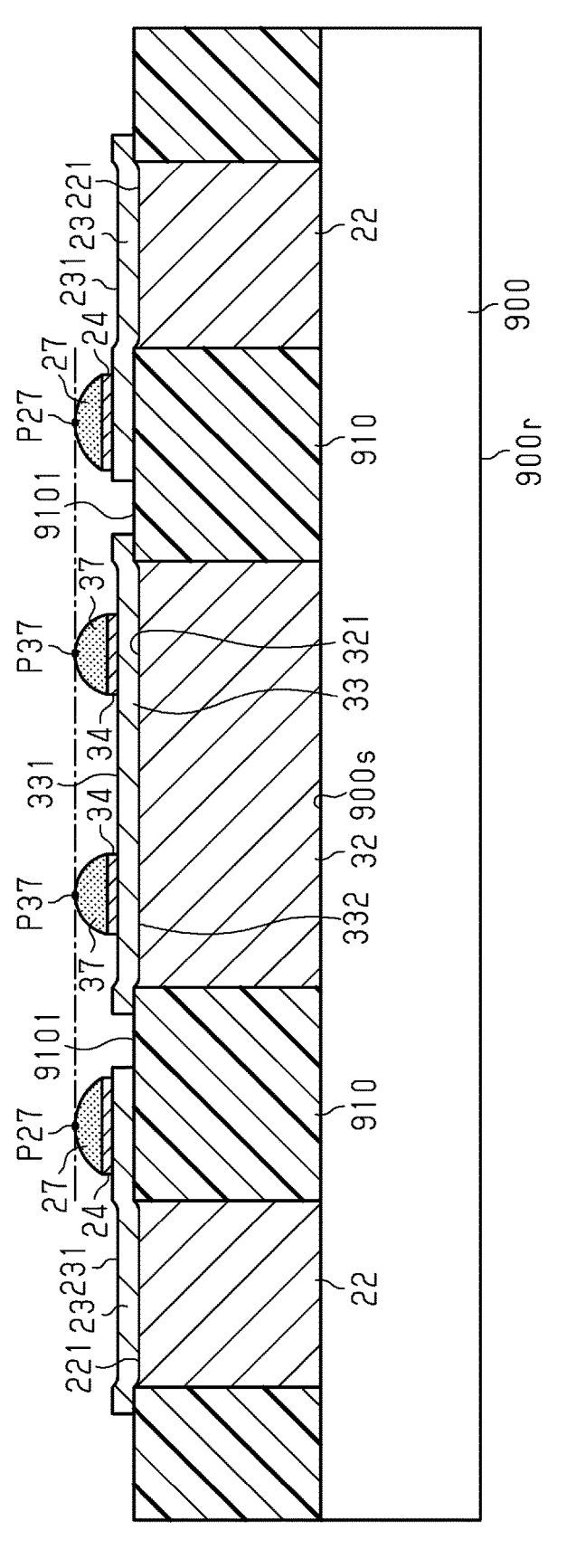
FIG. 11 is a schematic cross-sectional view illustrating a manufacturing step of the semiconductor device in accordance with the embodiment.

As shown in FIG. 11, the method for manufacturing the semiconductor device 1A includes a step of performing a flow process. The flow process planarizes the surfaces of the first substrate solder layer 27 and the second substrate solder layer 37. The flow process results in the surfaces of the first substrate solder layer 27 and the second substrate solder layer 37 being arched in a cross section extending in the thickness direction Z.

Figure 12:
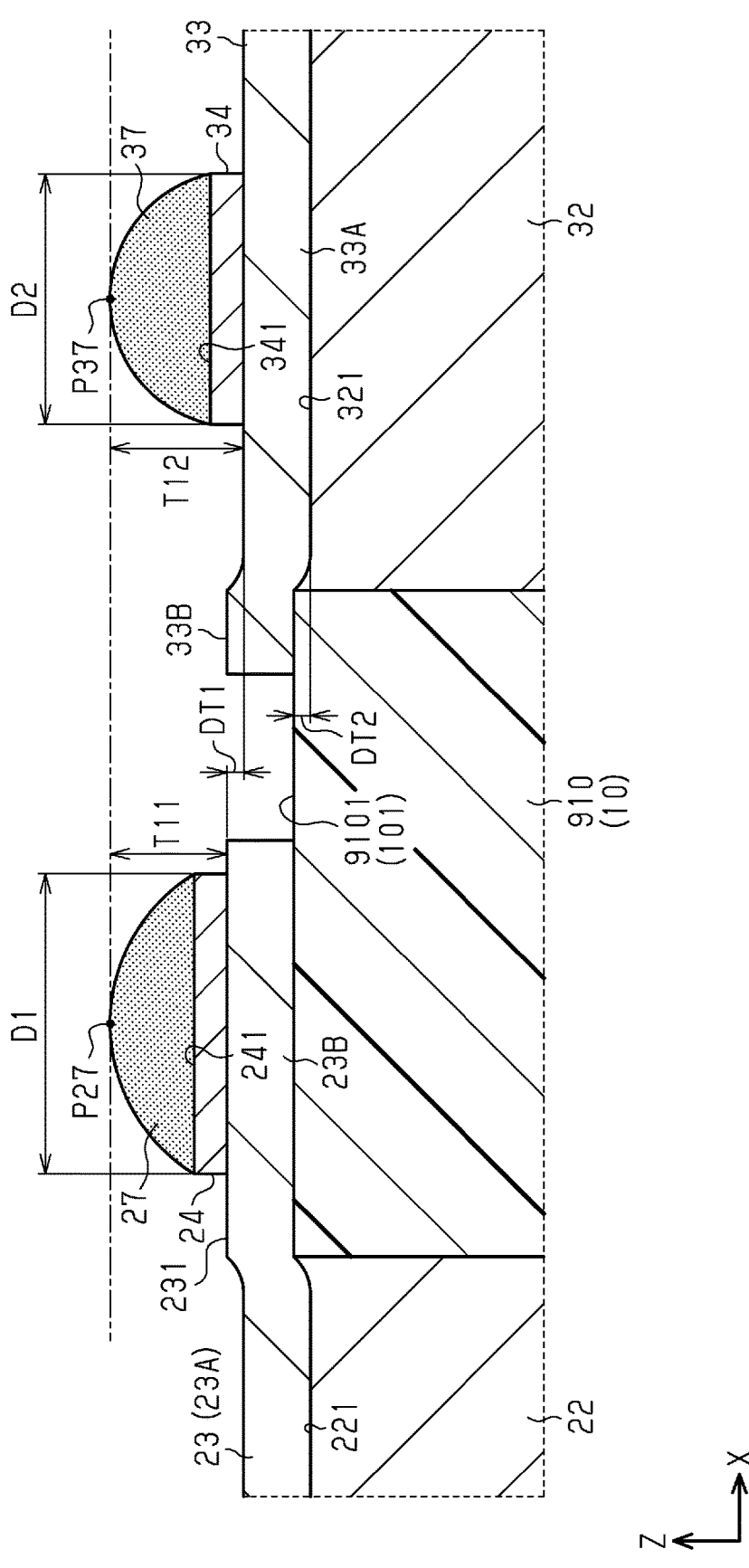
FIG. 12 is a cross-sectional view showing solder layers of a substrate and a semiconductor element in the embodiment.

FIGS. 11 and 12 show the state of the first substrate solder layer 27 and the second substrate solder layer 37 subsequent to the flow process. As shown in FIG. 12, the uppermost point (peak) P27 of the first substrate solder layer 27 and the uppermost point (peak) P37 of the second substrate solder layer 37 are located at the same position in the thickness direction Z. As shown in FIG. 12, subsequent to the flow process, the diameter of the first wiring line electrodes 24 and the diameter of the second wiring line electrodes 34, or the size of the openings 9021 and the size of the openings 9022 in the mask 902, are set so that the peak P27 of the first substrate solder layer 27 and the uppermost point P37 of the second substrate solder layer 37 are located at the same position in the thickness direction Z.

More specifically, the upper surface 221 of the first through-electrode 22 is recessed from the substrate main surface 101 of the substrate 10 into the first through-electrode 22. The first wiring line electrodes 24 have the same thickness as the second wiring line electrodes 34. Accordingly, the difference DT1 between the upper surface 241 of each first wiring line electrode 24 and the upper surface 341 of each second wiring line electrode 34 in the thickness direction Z is the same as the difference DT2 between the upper surface 221 of each first through-electrode 22 and the substrate main surface 101 of the substrate 10.

The height T12 of the second wiring line electrode 34 and the second substrate solder layer 37 is greater than the height T11 of the first wiring line electrode 24 and the first substrate solder layer 27. The height T11 of the first wiring line electrode 24 and the first substrate solder layer 27 is the distance, in the thickness direction Z, from the upper surface 231 of the first main surface wiring line 23 to the peak P27 of the first substrate solder layer 27. The height T11 of the second wiring line electrode 34 and the second substrate solder layer 37 is the distance from the upper surface 331 of the second main surface wiring line 33 to the peak P37 of the second substrate solder layer 37.

The first wiring line electrodes 24, the first substrate solder layer 27, the second wiring line electrodes 34, and the second substrate solder layer 37 are formed to absorb the difference DT1 between the upper surface 231 of the first main surface wiring line 23 and the upper surface 331 of the second main surface wiring line 33. Thus, the difference between the height T11 of the first wiring line electrode 24 and the first substrate solder layer 27 and the height T12 of the second wiring line electrode 34 and the second substrate solder layer 37 is equal to the difference DT1 of the upper surface 231 of the first main surface wiring line 23 and the upper surface 331 of the second main surface wiring line 33, or the difference DT2 of the substrate main surface 101 of the substrate 10 and the upper surface 321 of the second through-electrode 32.

Figure 13:
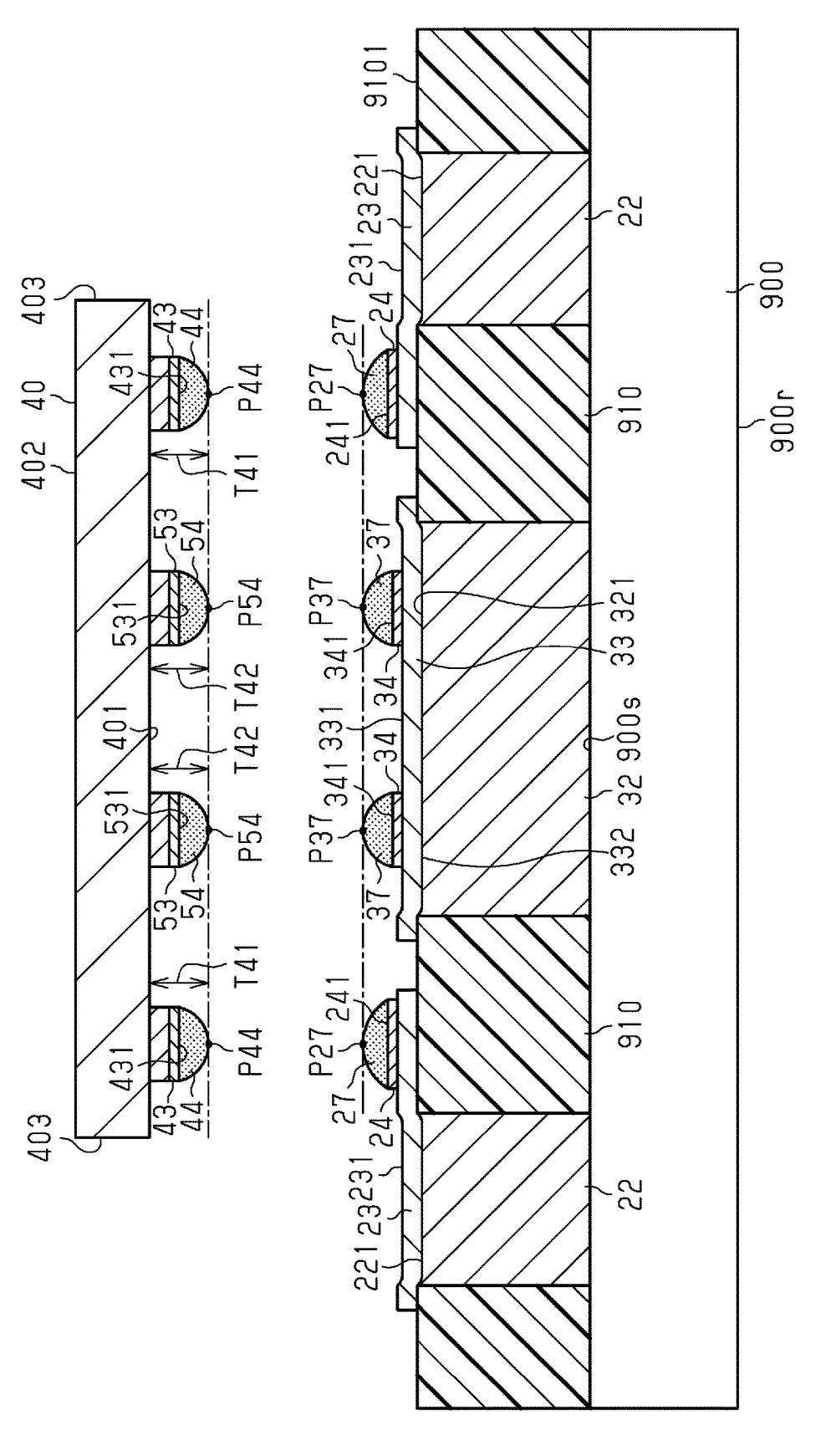
FIG. 13 is an enlarged cross-sectional view showing wiring line electrodes and a solder layer in the embodiment.
Figure 14:
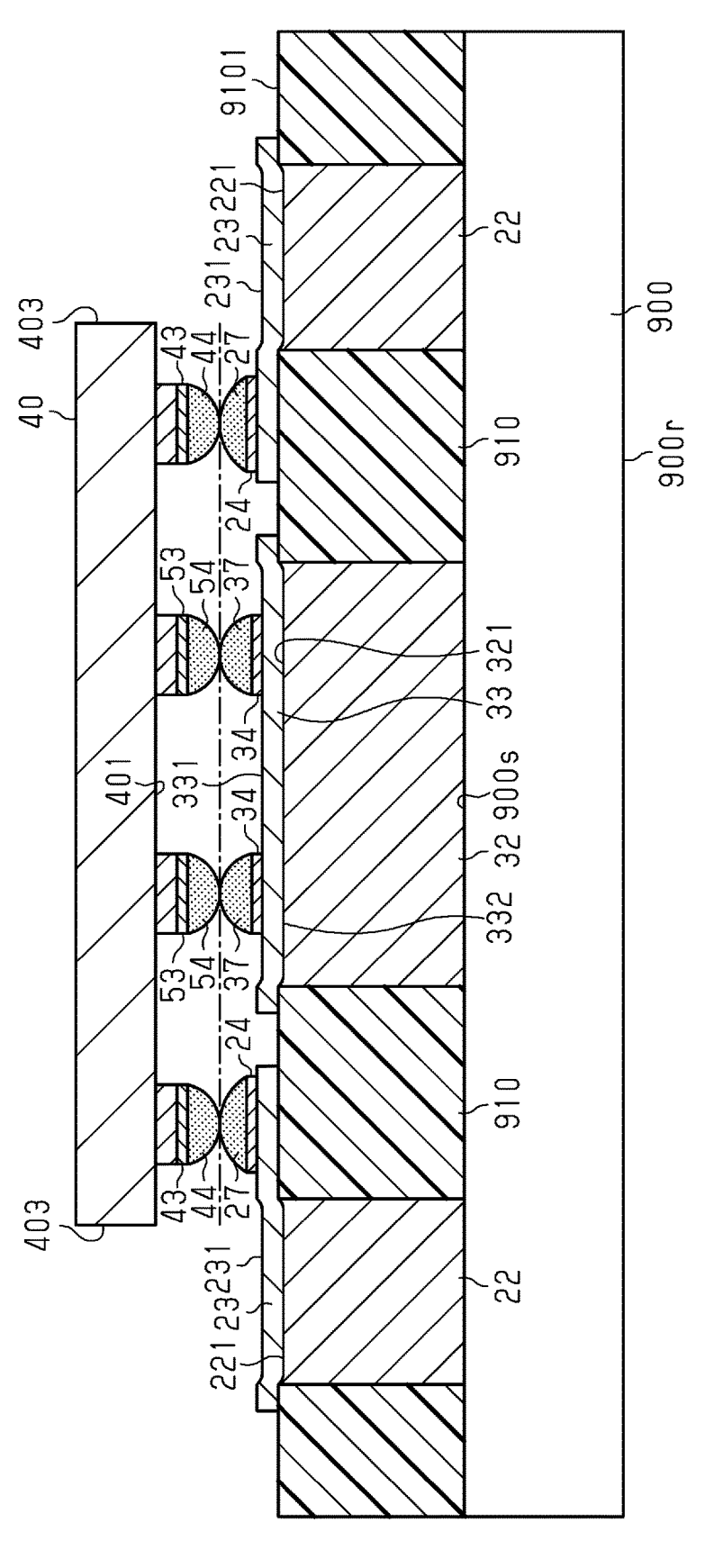
FIG. 14 is a cross-sectional view showing the joined state of the substrate and the semiconductor element in the embodiment.
Figure 15:
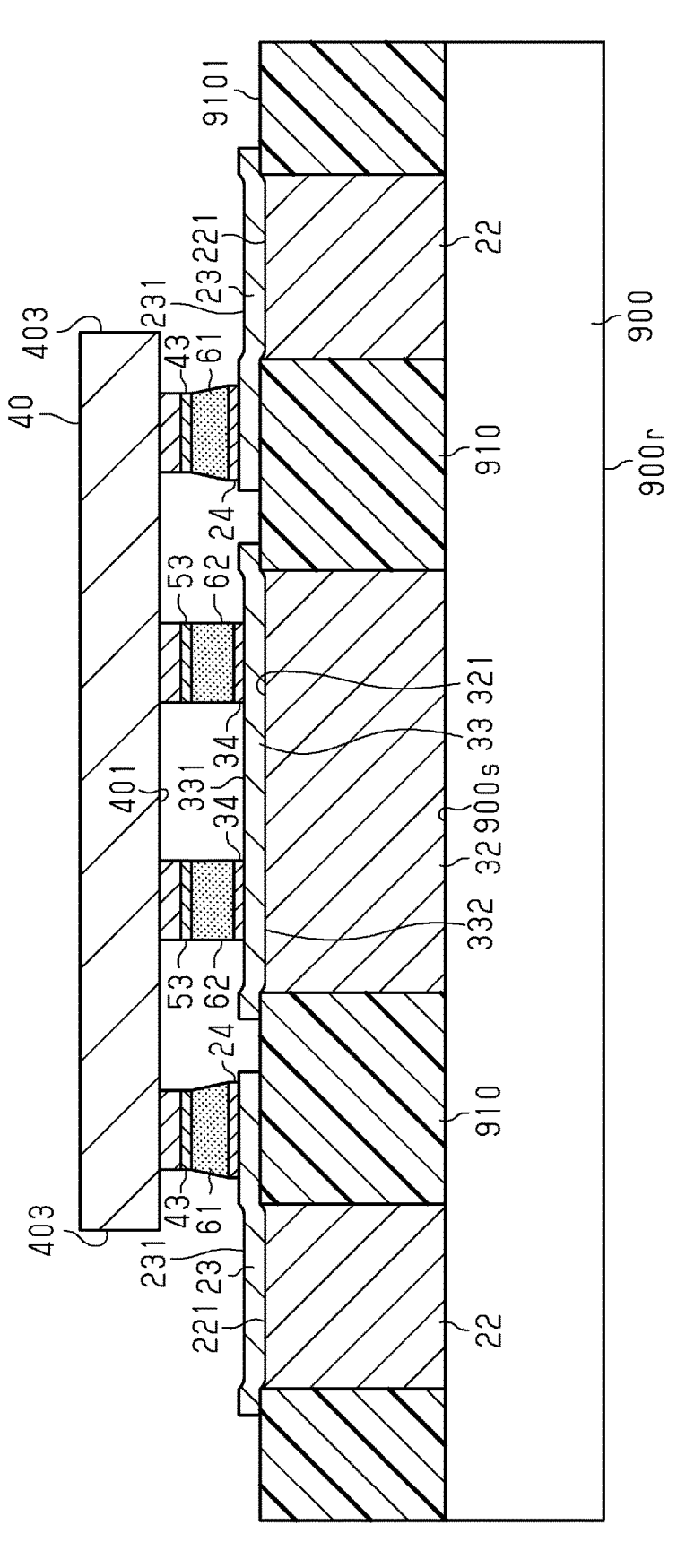
FIG. 15 is a schematic cross-sectional view illustrating a manufacturing step of the semiconductor device in accordance with the embodiment.

As shown in FIGS. 13 to 15, the method for manufacturing the semiconductor device 1A includes a step of mounting the semiconductor element 40. The step of mounting the semiconductor element 40 includes a step of flip-chip-mounting the semiconductor element 40 shown in FIGS. 13 and 14 and a reflow step shown in FIG. 15.

As shown in FIG. 13, the semiconductor element 40 is disposed with the element main surface 401 facing the base material 910. The semiconductor element 40 includes a first element solder layer 44 and a second element solder layer 54 respectively formed on the first element electrodes 43 and the second element electrodes 53. The first element solder layer 44 and the second element solder layer 54 form parts of the first joining members 61 and the second joining members 62 shown in FIGS. 3 and 5.

The first element solder layer 44 and the second element solder layer 54 are formed through an electrolytic plating process and a flow process. The first element solder layer 44 is formed by depositing a plating metal of an alloy including Sn and Ag on a lower surface 431 of each first element electrode 43. The second element solder layer 54 is formed by depositing a plating metal of an alloy including Sn and Ag on the lower surface 531 of each second element electrode 53. The flow process planarizes the surfaces of the first element solder layer 44 and the second element solder layer 54. The flow process results in the first element solder layer 44 and the second element solder layer 54 being arched in a cross section extending in the thickness direction Z.

The first element electrodes 43 and the second element electrodes 53 are equal in size, as viewed in the thickness direction Z. Accordingly, the height T41 of the first element solder layer 44 is equal to the height T42 of the second element solder layer 54. The height T41 of the first element solder layer 44 is the distance, in the thickness direction Z, from the first element electrode 43 to the lowermost point (peak) P44 of the first element solder layer 44. The height T42 of the second element solder layer 54 is the distance, in the thickness direction Z, from the second element electrode 53 to the lowermost point (peak) P54 of the second element solder layer 54. Accordingly, the peak P44 of the first element solder layer 44 and the peak P54 of the second element solder layer 54 are located at the same position in the thickness direction Z.

As shown in FIG. 14, the semiconductor element 40 is flip-chip-mounted using, for example, a flip-chip bonder that applies flux to the first element solder layer 44 and the second element solder layer 54.

The peak P27 of the first substrate solder layer 27 and the peak P37 of the second substrate solder layer 37 are located at the same position in the thickness direction Z. The peak P44 of the first element solder layer 44 and the peak P54 of the second element solder layer 54 are located at the same position in the thickness direction Z. Accordingly, the first element solder layer 44 and the second element solder layer 54 respectively contact the first substrate solder layer 27 and the second substrate solder layer 37.

Then, as shown in FIG. 15, the reflow process forms the first joining members 61 and the second joining members 62. The first joining members 61 are formed by the first substrate solder layer 27 and the first element solder layer 44 shown in FIG. 14. The second joining members 62 are formed by the second substrate solder layer 37 and the second element solder layer 54 shown in FIG. 14.

As shown in FIG. 14, the first substrate solder layer 27 contacts the first element solder layer 44. Thus, the first substrate solder layer 27 and the first element solder layer 44, which are molten in the reflow process, are joined with each other to form the first joining members 61 shown in FIG. 15. In the same manner, the second substrate solder layer 37 contacts the second element solder layer 54 as shown in FIG. 14. Thus, the second substrate solder layer 37 and the second element solder layer 54, which are molten in the reflow process, are joined with each other to form the second joining members 62 shown in FIG. 15.

A comparative example compared with the present embodiment will now be described. In the process for manufacturing a semiconductor device of the comparative example, which is compared with the present embodiment, FIGS. 16 and 17 show a step of flip-chip-mounting the semiconductor element 40. In the comparative example, same reference numerals are given to those members that are the same as the corresponding members in the semiconductor device 1A of the present embodiment. The semiconductor device of the comparative example differs from the semiconductor device 1A of the present embodiment and members related to its manufacturing process in the first wiring line electrodes 24, the second wiring line electrodes 34, the first substrate solder layer 27, and the second substrate solder layer 37.

As shown in FIGS. 16 and 17, as viewed in the thickness direction Z, the first wiring line electrodes 24 and the second wiring line electrodes 34 are equal in size, and the first substrate solder layer 27 and the second substrate solder layer 37 are identical in shape. Accordingly, the peak P37 of the second substrate solder layer 37 is located further toward the base material 910 from the peak P27 of the first substrate solder layer 27. Thus, as shown in FIG. 17, when flip-chip-mounting the semiconductor element 40, the first element solder layer 44 contacts the first substrate solder layer 27 but the second element solder layer 54 does not contact the second substrate solder layer 37. This hinders the joining of the second element solder layer 54 and the second substrate solder layer 37 in the reflow process and causes a mounting failure in which some element electrodes of the semiconductor element 40 are not connected to wiring line electrodes.

In contrast, the semiconductor device 1A of the present embodiment and its manufacturing method joins every one of the first element electrodes 43 and the second element electrodes 53 on the semiconductor element 40 with the first wiring line electrodes 24 and the second wiring line electrodes 34 on the base material 910. This reduces mounting failures of the semiconductor element 40.

Figure 18:
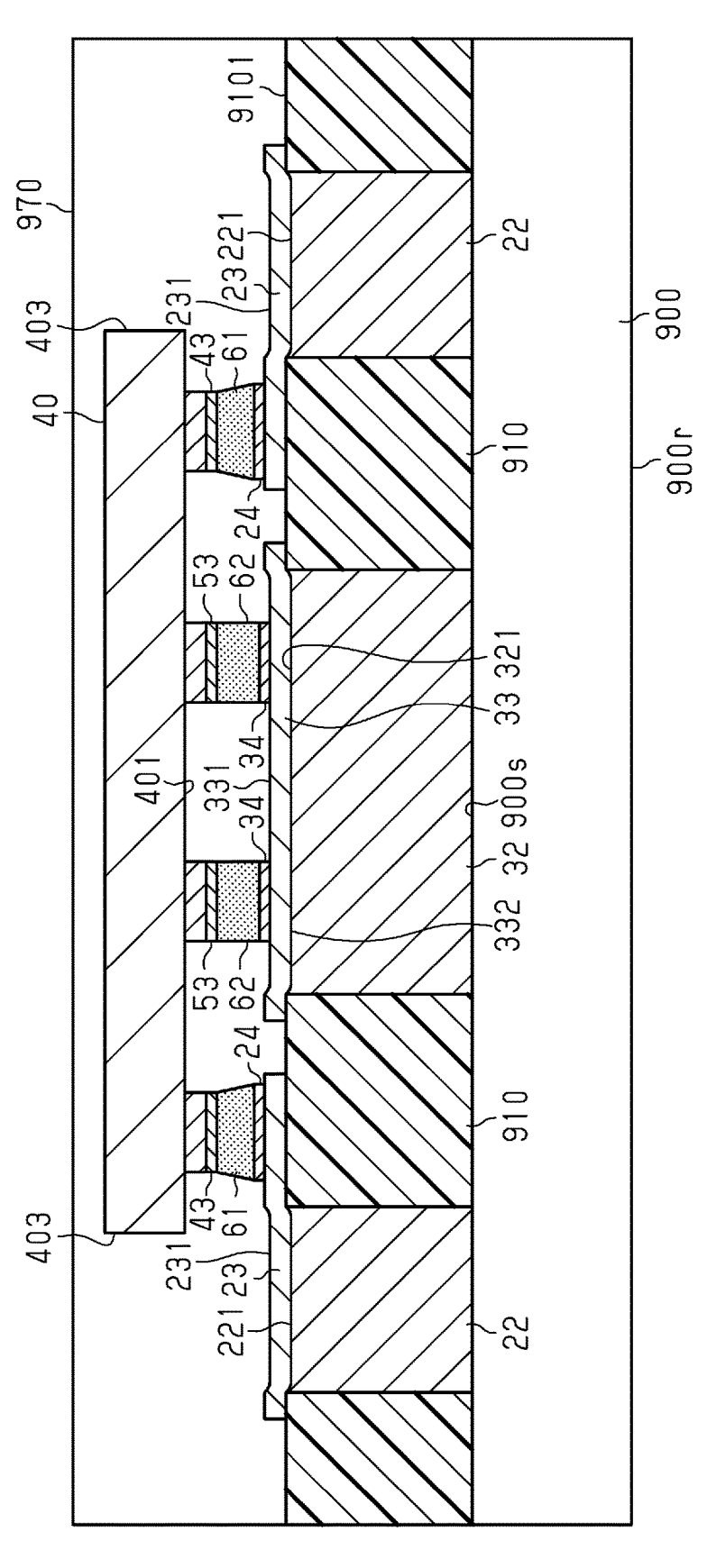
FIG. 18 is a schematic cross-sectional view illustrating a manufacturing step of the semiconductor device in accordance with the embodiment.

Returning to the method for manufacturing the semiconductor device 1A of the present embodiment, the steps subsequent to mounting will now be described. As shown in FIG. 18, the method for manufacturing the semiconductor device 1A includes a step of forming a resin layer 970 that covers the material main surface 9101 of the base material 910 and the semiconductor element 40. The resin layer 970 becomes the encapsulation resin 70 shown in FIGS. 1 to 5. The resin layer 970 is, for example, a synthetic resin of which the main component is an epoxy resin. The resin layer 970 is formed through, for example, compression molding. The resin layer 970 fills the gap between the element main surface 401 of the semiconductor element 40 and the material main surface 9101 of the base material 910.

Figure 19:
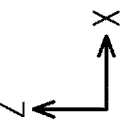
FIG. 19 is a schematic cross-sectional view illustrating a manufacturing step of the semiconductor device in accordance with the embodiment.
Figure 20:
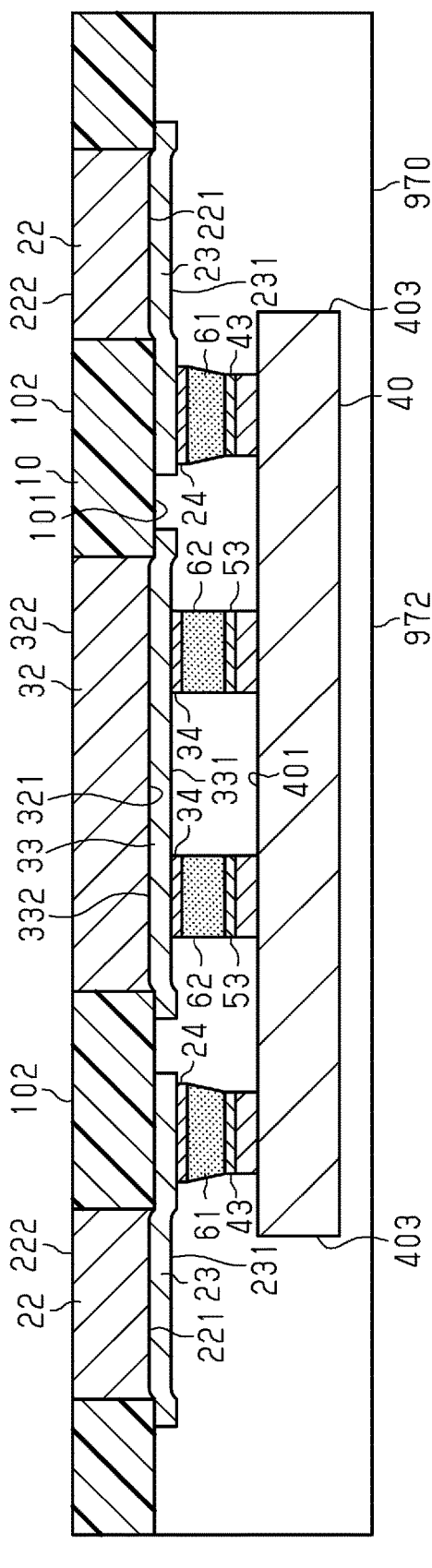
FIG. 20 is a schematic cross-sectional view illustrating a manufacturing step of the semiconductor device in accordance with the embodiment.

As shown in FIGS. 19 and 20, the method for manufacturing the semiconductor device 1A includes a step of removing the support substrate 900. Dicing tape (not shown) is applied to a lower surface 972 of the resin layer 970, and the support substrate 900 shown in FIG. 18 is removed. The upper and lower sides in FIG. 18 are reversed in FIG. 19. The support substrate 900 is removed through, for example, grinding. Further, the first terminal pillars 922 and the second terminal pillar 932 of the base material 910 are partially ground. The base material 910, the first terminal pillars 922, and the second terminal pillar 932 are ground from the side located toward the support substrate 900 to the broken line shown in FIG. 19. The base material 910, the first terminal pillars 922, and the second terminal pillar 932 may be ground subsequent to removal of the support substrate 900. This forms the substrate 10 and the first through-electrodes 22 and the second through-electrode 32 that extend through the substrate 10.

Figure 21:
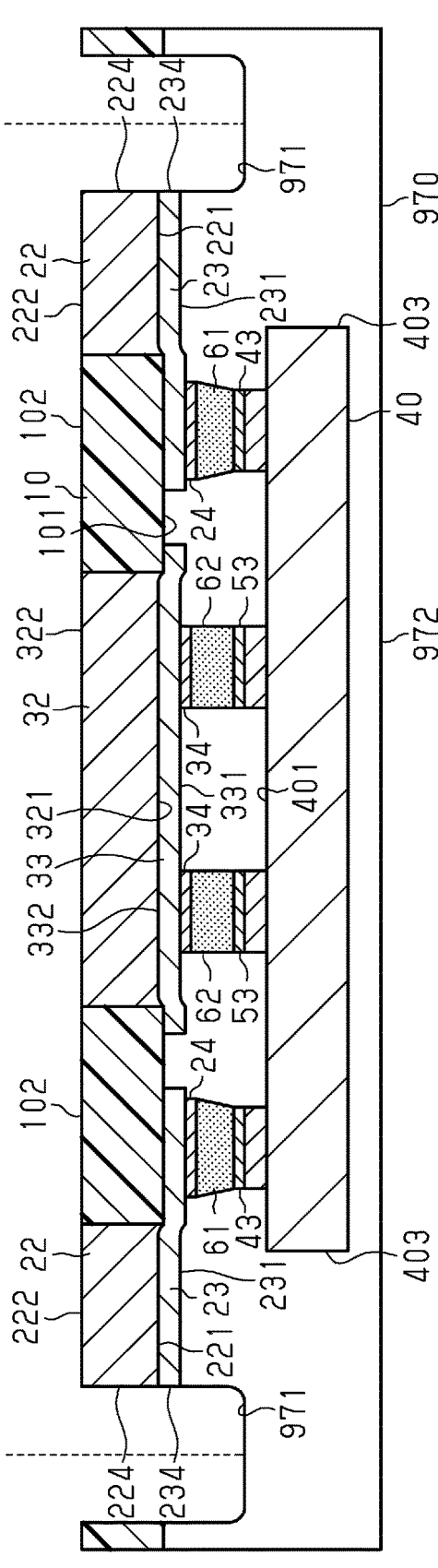
FIG. 21 is a schematic cross-sectional view illustrating a manufacturing step of the semiconductor device in accordance with the embodiment.

As shown in FIG. 21, the method for manufacturing the semiconductor device 1A includes a step of cutting the base material 910 and cutting (half-cutting) part of the resin layer 970 in the thickness direction Z. A dicing plate cuts the base material 910 and half-cuts the resin layer 970 along cutting lines (broken lines) shown in FIG. 21 from the side of the base material 910 toward the lower surface 972 of the resin layer 970. The half-cutting of the resin layer 970 forms an isolation trench 971 in the resin layer 970. When the dicing plate cuts the base material 910 and half-cuts the resin layer 970, the first main surface wiring lines 23 are cut. This forms the substrate 10 and the first main surface wiring lines 23. More specifically, the side surfaces 224 of the first through-electrodes 22 and the side surfaces 234 of the first main surface wiring lines 23 are formed. The side surfaces 224 of the first through-electrodes 22 and the side surfaces 234 of the first main surface wiring lines 23 are exposed in the isolation trench 971. The first through-electrodes 22 and the first main surface wiring lines 23, which are formed in this manner, form the first wiring portions 21.

Figure 22:
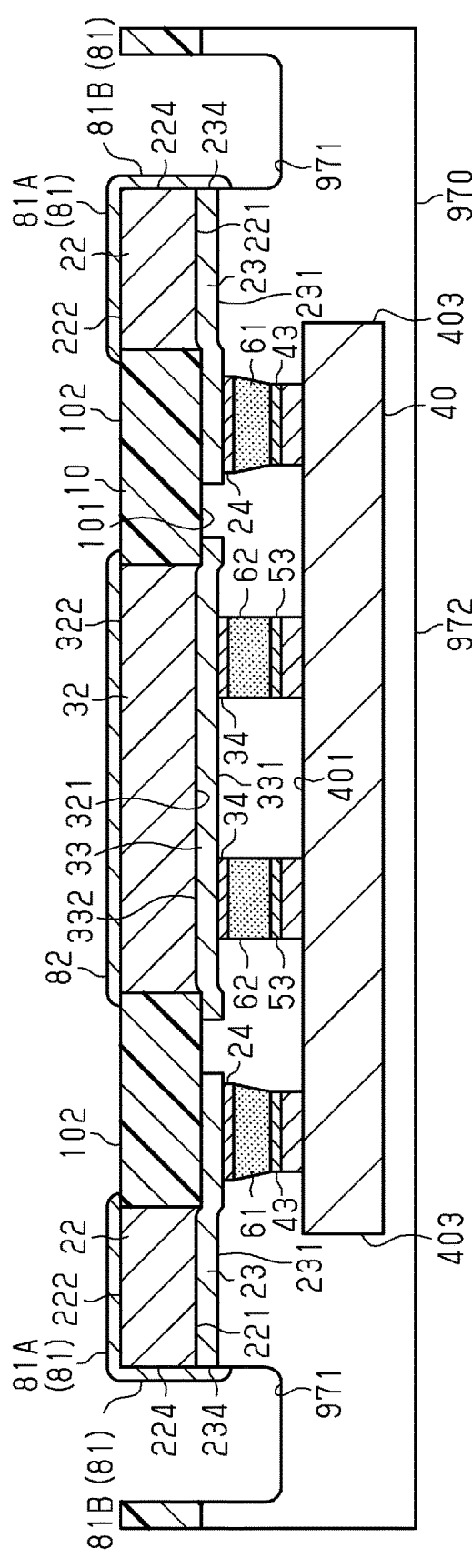
FIG. 22 is a schematic cross-sectional view illustrating a manufacturing step of the semiconductor device in accordance with the embodiment.
Figure 22:
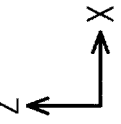

As shown in FIG. 22, the method for manufacturing the semiconductor device 1A includes a step of forming the first external conductive film 81 and the second external conductive film 82. The first external conductive film 81 includes the first conductive film 81A, which covers the lower surface 222 of the first through-electrode 22, and the second conductive film 81B, which covers the side surfaces 224 and 234 of the first through-electrodes 22 and the first main surface wiring lines 23. The second conductive film 81B is formed in the isolation trench 971. The second external conductive film 82 covers the lower surface 322 of the second through-electrode 32.

The first external conductive film 81 and the second external conductive film 82 are each formed from a plating metal. For example, electroless plating is performed to deposit a plating metal, for example, Ni, Pd, and Au in this order, on the first external conductive film 81 and the second external conductive film 82. There is no limitation to the structures of the first external conductive film 81 and the second external conductive film 82 and how they are formed.

Figure 23:
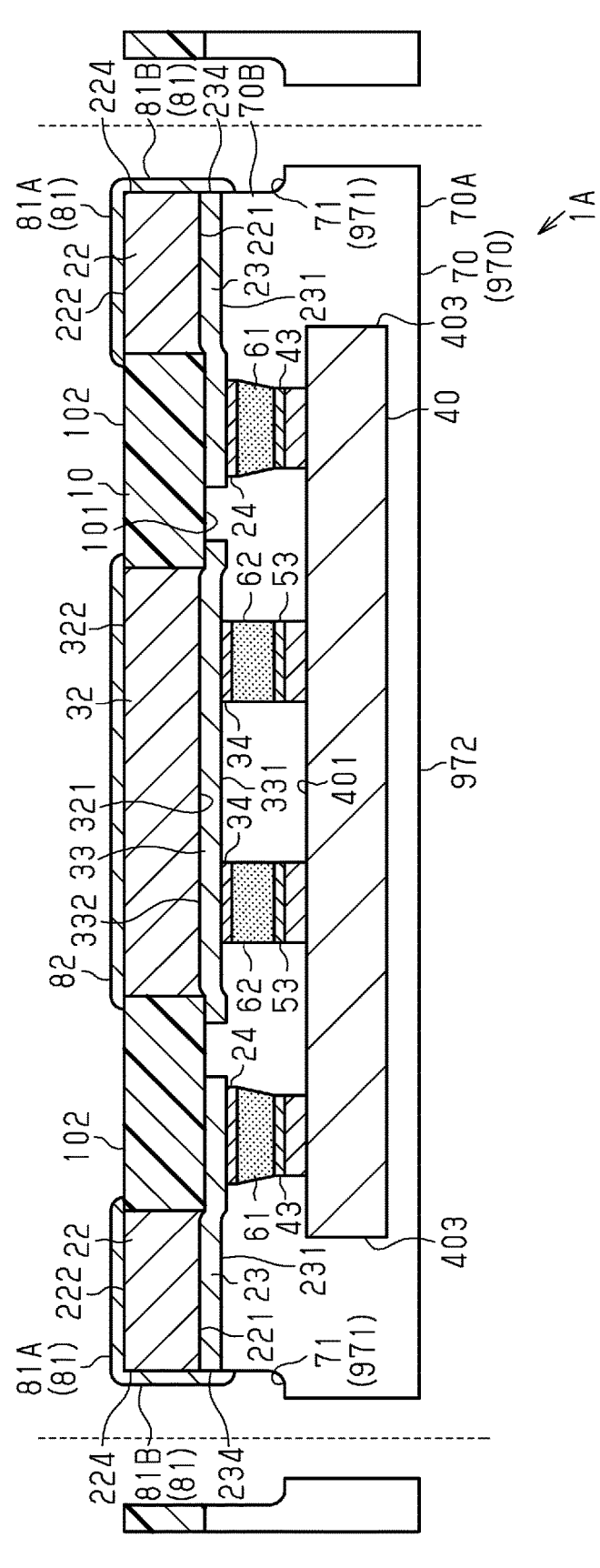
FIG. 23 is a schematic cross-sectional view illustrating a manufacturing step of the semiconductor device in accordance with the embodiment.
Figure 23:
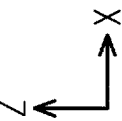

As shown in FIG. 23, the method for manufacturing the semiconductor device 1A includes a step of fragmenting the semiconductor device 1A.

The resin layer 970 is cut and divided into fragments, with each unit being the semiconductor element 40. The fragmentation is performed using, for example, a dicing blade having a smaller width than the dicing blade used to half-cut the resin layer 970 is used to cut the resin layer 970 from the isolation trench 971 of the resin layer 970 to the lower surface 972. Each fragment is the semiconductor device 1A including the substrate 10 and the encapsulation resin 70. In other words, the dicing blade, which has a smaller width than the dicing blade used to half-cut the resin layer 970, cuts the resin layer 970 to the lower surface 972 and forms the step 71 of the resin layer 970. This forms the encapsulation resin 70. More specifically, the resin side surface 703, the first resin portion 70A, and the second resin portion 70B are formed as the encapsulation resin 70. The semiconductor device 1A is manufactured through the steps described above.

Operation

The operation of the semiconductor device 1A of the present embodiment will now be described.

The semiconductor device 1A includes the substrate 10, the first wiring portions 21, the second wiring portion 31, and the semiconductor element 40. The substrate 10 includes the substrate main surface 101 facing the thickness direction. The semiconductor element 40 includes the element main surface 401 facing the substrate main surface 101, the first element electrodes 43 formed on the element main surface 401, and the second element electrodes 53 formed on the element main surface 401.

Each first wiring portion 21 includes the first through-electrode 22, the first main surface wiring line 23, and the first wiring line electrode 24. The first through-electrode 22 extends through the substrate 10 and includes the upper surface 221 facing the same direction as the substrate main surface 101. The first main surface wiring line 23 contacts the substrate main surface 101 and the upper surface 221 and includes the upper surface 231 facing the same direction as the substrate main surface 101. The first wiring line electrode 24 is formed on the upper surface 231.

The second wiring portion 31 includes the second through-electrode 32, the second main surface wiring line 33, and the second wiring line electrodes 34. The second through-electrode 32 extends through the substrate 10 and includes the upper surface 321 facing the same direction as the substrate main surface 101. The second main surface wiring line 33 contacts the substrate main surface 101 and the upper surface 321 and includes the upper surface 331 facing the same direction as the substrate main surface 101. The second wiring line electrodes 34 are formed on the upper surface 331. The upper surface 221 is recessed into the first through-electrode 22. The upper surface 321 is recessed into the second through-electrode 32. The first wiring line electrodes 24, which are formed on the upper surfaces 231 of the first main surface wiring lines 23, are larger than the second wiring line electrodes 34, which are formed on the upper surface 331 of the second main surface wiring line 33, as viewed in the thickness direction Z.

The first wiring line electrodes 24 are joined with the first element electrodes 43 of the semiconductor element 40 by the first joining members 61. The second wiring line electrodes 34 are joined with the second element electrodes 53 of the semiconductor element 40 by the second joining members 62. The first joining members 61 are formed by joining the first substrate solder layer 27, which is formed on the upper surface 241 of each first wiring line electrode 24, with the first element solder layer 44, which is formed on the lower surface 431 of each first element electrode 43 of the semiconductor element 40. The second joining members 62 are formed by joining the second substrate solder layer 37, which is formed on the upper surface 341 of each second wiring line electrode 34, with the second element solder layer 54, which is formed on the lower surface 531 of each second element electrode 53 of the semiconductor element 40.

The first wiring line electrodes 24 are formed on the upper surfaces 231 of the first main surface wiring lines 23 that contact the substrate main surface 101 of the substrate 10. The second wiring line electrodes 34 are formed on the upper surface 331 of the second main surface wiring line 33 that contacts the upper surface 321 of the second through-electrode 32.

As viewed in the thickness direction Z, when the first wiring line electrodes 24 have the same size as the second wiring line electrodes 34, the height of the first wiring line electrode 24 and the first substrate solder layer 27 will be equal to the height of the second wiring line electrode 34 and the second substrate solder layer 37. Thus, the peak P37 of the second substrate solder layer 37 will be lower than the peak P27 of the first substrate solder layer 27. If the first substrate solder layer 27 contacts the first element solder layer 44 when mounting the semiconductor element 40, the second substrate solder layer 37 may be separated from the second element solder layer 54. Thus, the second substrate solder layer 37 will not be joined with the second element solder layer 54. This will cause a mounting failure of the semiconductor element 40.

In the present embodiment, the first wiring line electrode 24, which is formed on the upper surface 231 of each first main surface wiring line 23, is larger than the second wiring line electrode 34, which is formed on the upper surface 331 of the second main surface wiring line 33, as viewed in the thickness direction Z. Thus, the height of the second wiring line electrode 34 and the second substrate solder layer 37 is greater than the height of the first wiring line electrode 24 and the first substrate solder layer 27, and the peak P37 of the second substrate solder layer 37 and the peak P27 of the first substrate solder layer 27 are located at the same position in the thickness direction Z. When mounting the semiconductor element 40, if the first substrate solder layer 27 contacts the first element solder layer 44, the second substrate solder layer 37 will contact the second element solder layer 54. This allows the second substrate solder layer 37 to be joined with the second element solder layer 54 and reduces mounting failures of the semiconductor element 40.

As shown in FIG. 3, the semiconductor device 1A includes the second wiring portion 31 that overlaps at least part of the semiconductor element 40 as viewed in the thickness direction Z, extends through the substrate 10 from the substrate main surface 101 to the substrate back surface 102, and has a higher thermal conductivity than the substrate 10. Accordingly, the semiconductor device 1A dissipates the heat generated by the semiconductor element 40 toward the substrate back surface 102 of the substrate 10 and out of the semiconductor device 1A.

The second wiring portion 31 includes the single second through-electrode 32 that extends through the substrate 10. The second through-electrode 32 is a quadrangular flat plate, as viewed in the thickness direction Z. Accordingly, the second wiring portion 31 has a small heat capacity and facilitates the dissipation of heat from the semiconductor element 40.

The second through-electrode 32 of the second wiring portion 31 is a quadrangular flat plate, as viewed in the thickness direction Z. The second through-electrode 32 transfers heat in the first direction X and the second direction Y, which are orthogonal to the thickness direction Z. Accordingly, the second wiring portion 31, for example, dissipates the heat locally generated in the element main surface 401 of the semiconductor element 40, such as a power transistor, in the first direction X and the second direction Y, which are orthogonal to the thickness direction Z.

The semiconductor element 40 includes the first connection pads 41 and the second connection pads 51. The first connection pads 41 are input-output terminal for signals or the like used to operate the semiconductor element 40. The second connection pads 51 are terminals insulated from the first connection pads or terminals that do not affect the electrical characteristics of the semiconductor element 40.

The second connection pads 51 are connected to the second wiring portion 31. The second wiring portion 31 is used to dissipate heat of the semiconductor element 40. This allows for efficient dissipation of heat from the semiconductor element 40 without affecting the electrical characteristics of the semiconductor element 40.

The second external conductive film 82 is formed on the substrate back surface 102 of the substrate 10 so as to cover the lower surface 322 of the second through-electrode 32. The second external conductive film 82 has a large surface area to dissipate heat. This further dissipates heat efficiently.

The second through-electrode 32 is formed from a plating metal. The first wiring portions 21 of the semiconductor device 1A include the first through-electrodes 22 that extend through the substrate 10. The first through-electrodes 22 are formed from a plating metal. The second through-electrode 32 of the second wiring portion 31 is formed at the same time as the first through-electrodes 22 of the first wiring portions 21. Thus, in the manufacturing process of the semiconductor device 1A, the second through-electrode 32 is formed efficiently when the first through-electrodes 22 are formed.

The semiconductor device 1A includes the first external conductive film 81 and the second external conductive film 82. The first external conductive film 81 and the second external conductive film 82 are formed from a plating metal. The second external conductive film 82 of the second wiring portion 31 is formed at the same time as the first external conductive film 81, which covers the first wiring portions 21. Thus, in the manufacturing process of the semiconductor device 1A, the second external conductive film 82 is formed efficiently when the first external conductive film 81 is formed.

The second external conductive film 82 may be connected to, for example, a circuit board. A circuit board for mounting of the semiconductor device 1A includes pads connected to the first external conductive film 81 of the semiconductor device 1A. The first external conductive film 81 is connected to the pads of the circuit board by, for example, solder. The circuit board includes pads facing the second external conductive film 82. The pads are connected to the second external conductive film 82 by, for example, solder. This allows the heat transferred from the semiconductor element 40 to the second wiring portion 31 to be dissipated from the second external conductive film 82 of the second wiring portion 31 to the circuit board. A heat dissipator formed from, for example, a metal such as Al, may be connected to the second external conductive film 82.

The above present embodiment has the advantages described below.

(1) The semiconductor device 1A includes the substrate 10, the first wiring portions 21, the second wiring portion 31, and the semiconductor element 40. The substrate 10 includes the substrate main surface 101 facing the thickness direction. The semiconductor element 40 includes the element main surface 401 facing the substrate main surface 101, the first element electrodes 43 formed on the element main surface 401, and the second element electrodes 53 formed on the element main surface 401. Each first wiring portion 21 includes the first through-electrode 22, the first main surface wiring line 23, and the first wiring line electrode 24.

The first through-electrode 22 extends through the substrate 10 and includes the upper surface 221 facing the same direction as the substrate main surface 101. The first main surface wiring line 23 contacts the substrate main surface 101 and the upper surface 221 and includes the upper surface 231 facing the same direction as the substrate main surface

101. The first wiring line electrode 24 is formed on the upper surface 231. The second wiring portion 31 includes the second through-electrode 32, the second main surface wiring line 33, and the second wiring line electrodes 34. The second through-electrode 32 extends through the substrate 10 and includes the upper surface 321 facing the same direction as the substrate main surface 101. The second main surface wiring line 33 contacts the substrate main surface 101 and the upper surface 321, and includes the upper surface 331 facing the same direction as the substrate main surface 101. The second wiring line electrodes 34 are formed on the upper surface 331. The upper surface 221 is recessed into the first through-electrode 22. The upper surface 321 is recessed into the second through-electrode 32. The first wiring line electrodes 24, which are formed on the upper surfaces 231 of the first main surface wiring lines 23, are larger than the second wiring line electrodes 34, which are formed on the upper surface 331 of the second main surface wiring line 33, as viewed in the thickness direction Z.

The first wiring line electrodes 24 are joined with the first element electrodes 43 of the semiconductor element 40 by the first joining members 61. The second wiring line electrodes 34 are joined with the second element electrodes 53 of the semiconductor element 40 by the second joining members 62.

The first joining members 61 are formed by joining the first substrate solder layer 27, which is formed on the upper surface 241 of each first wiring line electrode 24, with the first element solder layer 44, which is formed on the lower surface 431 of each first element electrode 43 of the semiconductor element 40. The second joining members 62 are formed by joining the second substrate solder layer 37, which is formed on the upper surface 341 of each second wiring line electrode 34, with the second element solder layer 54, which is formed on the lower surface 531 of each second element electrode 53 of the semiconductor element 40. When mounting the semiconductor element 40, if the first substrate solder layer 27 contacts the first element solder layer 44, the second substrate solder layer 37 will contact the second element solder layer 54. This allows the second substrate solder layer 37 to be joined with the second element solder layer 54 and reduces mounting failures of the semiconductor element 40.

(2) The second through-electrode 32 of the second wiring portion 31 overlaps the semiconductor element 40 as viewed in the thickness direction Z and extends through the substrate 10 from the substrate main surface 101 to the substrate back surface 102. The second through-electrode 32 has a higher thermal conductivity than the substrate 10. Accordingly, the semiconductor device 1A transfers the heat generated by the semiconductor element 40 toward the substrate back surface 102 of the substrate 10 and dissipates the heat out of the semiconductor device 1A.

(3) The second wiring portion 31 includes the single second through-electrode 32 that extends through the substrate 10. The second through-electrode 32 is a quadrangular flat plate, as viewed in the thickness direction Z. Accordingly, the second wiring portion 31 has a small heat capacity and facilitates the dissipation of heat from the semiconductor element 40.

(4) The second through-electrode 32 of the second wiring portion 31 is a quadrangular flat plate, as viewed in the thickness direction Z. The second through-electrode 32 transfers heat in the first direction X and the second direction Y, which are orthogonal to the thickness direction Z. Accordingly, the second wiring portion 31, for example, dissipates the heat locally generated in the element main surface 401 of the semiconductor element 40, such as a power transistor, in the first direction X and the second direction Y, which are orthogonal to the thickness direction Z.

(5) The second wiring portion 31 is connected to wiring lines that are electrically insulated from or have no electrical effect on the first wiring portions 21 of the semiconductor element 40. This allows for the dissipation of heat from the semiconductor element 40 without affecting the electrical characteristics of the semiconductor element 40.

(6) The second through-electrode 32 is formed from a plating metal. The first wiring portions 21 of the semiconductor device 1A include the first through-electrodes 22 that extend through the substrate 10. The first through-electrodes 22 are formed from a plating metal. The second through-electrode 32 of the second wiring portion 31 is formed at the same time as the first through-electrodes 22 of the first wiring portions 21. Thus, in the manufacturing process of the semiconductor device 1A, the second through-electrode 32 is formed efficiently when the first through-electrodes 22 are formed.

(7) The semiconductor device 1A includes the first external conductive film 81, which covers the first wiring portions 21, and the second external conductive film 82, which covers the second wiring portion 31. The first external conductive film 81 and the second external conductive film 82 are formed from a plating metal. The second external conductive film 82 of the second wiring portion 31 is formed at the same time as the first external conductive film 81, which covers the first wiring portions 21. Thus, in the manufacturing process of the semiconductor device 1A, the second external conductive film 82 is formed efficiently when the first external conductive film 81 is formed.

(8) The second wiring portion 31 includes the second external conductive film 82. The second external conductive film 82 is formed on the substrate back surface 102 of the substrate 10 so as to cover the lower surface 322 of the second through-electrode 32. The second external conductive film 82 allows heat to be dissipated further efficiently.

(9) The second external conductive film 82 can also be connected to, for example, a circuit board. This allows the heat transferred from the semiconductor element 40 to the second wiring portion 31 to be dissipated from the second external conductive film 82 of the second wiring portion 31 to the circuit board.

(10) When the semiconductor device 1A is mounted on a circuit board, solder for connecting the first external conductive film 81 to the connection pads of the circuit board is applied between the first conductive film 81A and the connection pads and also to the second conductive film 81B. More specifically, solder that is in a liquid phase during a reflow process moves onto the second conductive film 81B and forms a fillet between the second conductive film 81B and the connection pads. The solder fillet enlarges the solder joining area and further increases the connection strength. Further, the solder fillet allows the soldered state of the semiconductor device 1A to be checked from the outer side.

(11) The semiconductor device 1A includes the second main surface wiring line 33, which is connected to the upper surface 321 of the second through-electrode 32. The second main surface wiring line 33 includes the extension 33B, which extends outward from the side surfaces 323 of the second through-electrode 32. The extension 33B contacts the substrate main surface 101 around the second through-electrode 32. This restricts separation of the second through-electrode 32 from the substrate 10.

(12) The second wiring line electrodes 34 are equal in size to the second element electrodes 53, as viewed in the thickness direction Z. This reduces the stress acting on the second joining members 62, which connect the second wiring line electrodes 34 and the second element electrodes 53. When the stress applied to the second joining members 62 is large, the second joining members 62 may crack. Thus, the reduction in stress will limit cracking of the second joining members 62.

Modified Examples

The embodiment described above exemplifies, without any intention to limit, applicable forms of a semiconductor device and a method for manufacturing a semiconductor device according to this disclosure. The semiconductor device and method for manufacturing a semiconductor device in accordance with this disclosure may be modified from the embodiment described above. For example, the configuration in the above embodiment may be replaced, changed, or omitted in part or include an additional element.

The modified examples described below may be combined as long as there is no technical contradiction. For the sake of convenience, the modified examples described below will basically be applied to the above embodiment but may also be applied to other embodiments as long as there is no technical contradiction.

In the above embodiment, the second wiring line electrodes 34 may be greater in size than the second element electrodes 53. This will increase the tolerance allowed for displacement when joining the semiconductor element 40 with the substrate 10. Thus, the semiconductor element 40 can be readily joined with the substrate 10.

Figure 24:
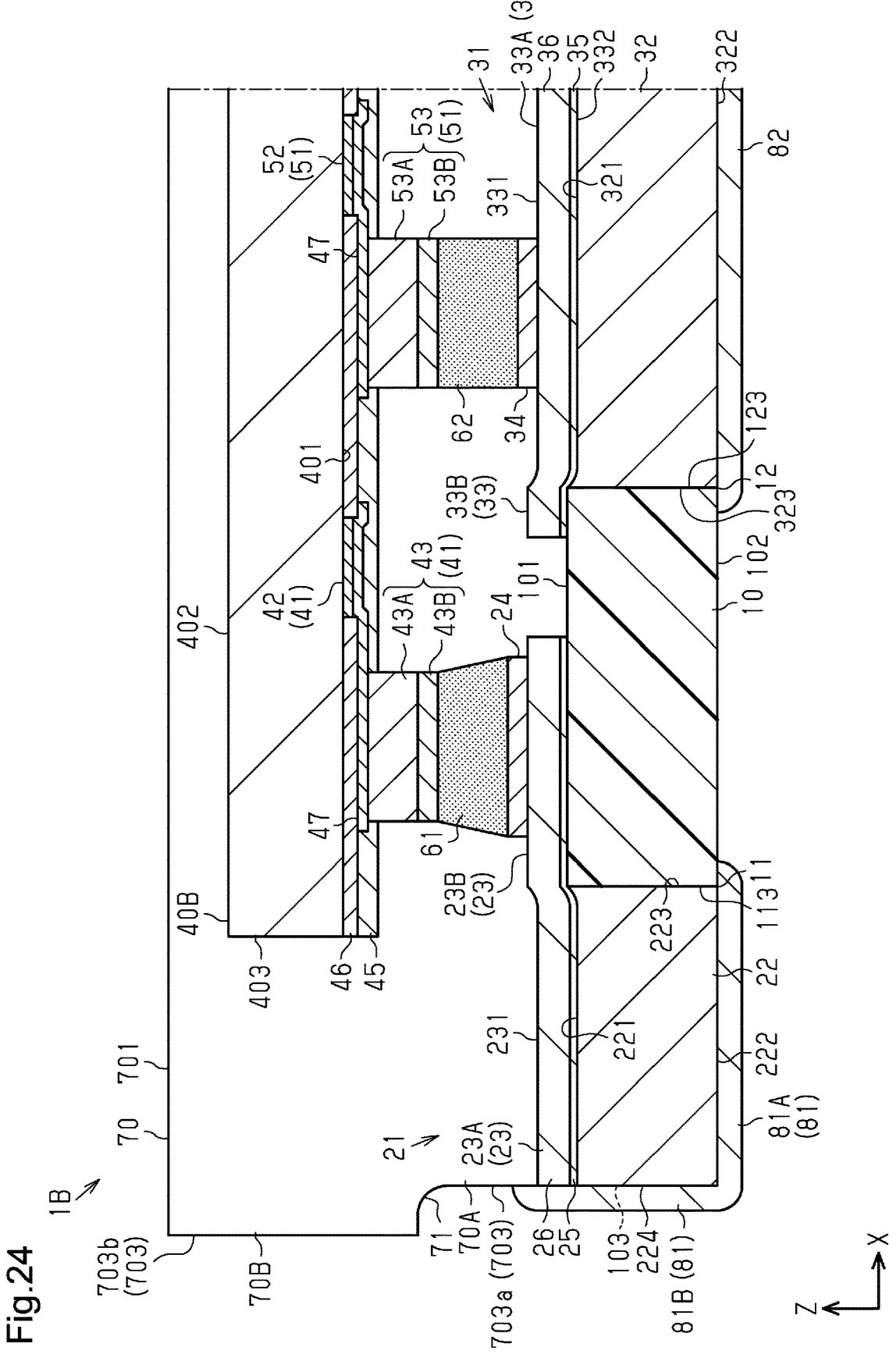
FIG. 24 is an enlarged cross-sectional view showing part of a modified example of the semiconductor device.

FIG. 24 shows a semiconductor device 1B including a semiconductor element 40B that differs in structure from the above embodiment.

The semiconductor element 40B includes an insulation film 46 and a rewiring layer 47.

The insulation film 46 covers the surface of the element substrate, the edges of the first electrode pads 42, and the edges of the second electrode pads 52. The insulation film 46 is formed from, for example, SiN. The rewiring layer 47 covers the surfaces of the first electrode pads 42 and the second electrode pads 52, extends to the insulation film 46, and contacts the insulation film 46. The rewiring layer 47 is formed from, for example, Cu or a Cu alloy. The protective film 45 covers the surface of the insulation film 46 and parts of the rewiring layer 47. The openings 451 and 452 in the protective film 45 expose parts of the rewiring layer 47 as connection terminals. The first openings 451 expose the rewiring layer 47 as connection terminals at positions that do not overlap the first electrode pads 42 in the thickness direction Z. The second openings 452 expose the rewiring layer 47 as connection terminals at positions that do not overlap the second electrode pad 52 in the thickness direction Z.

The first element electrodes 43 are connected to the rewiring layer 47 exposed through the first openings 451. The second element electrodes 53 are connected to the rewiring layer 47 exposed through the second openings 452. The first electrode pads 42 do not overlap the first element electrodes 43 in the thickness direction Z. Thus, the first electrode pads 42 and the first element electrodes 43 are separated in a direction intersecting the thickness direction Z. The second electrode pads 52 do not overlap the second element electrodes 53 in the thickness direction Z. Thus, the second electrode pads 52 and the second element electrodes 53 are separated in a direction intersecting the thickness direction Z.

The first external conductive film 81 and the second external conductive film 82 of the semiconductor device 1B are connected to a circuit board on which the semiconductor device 1B is mounted.

Depending on changes in the temperature of the environment in which the semiconductor device 1B and the circuit board are used, hard metal members such as the second through-electrode 32 may produce stress. To counter such stress, the second electrode pads 52 are separated in the direction intersecting the thickness direction Z from where the second element electrodes 53 are arranged on the second through-electrode 32, the second main surface wiring line 33, the second wiring line electrodes 34, and the second joining members 62 in the thickness direction Z. This limits the stress, which is caused by a change in temperature or the like, applied to the second electrode pads 52. That is, stress is reduced. This reduces the stress received by the semiconductor element 40B.

Figure 25:
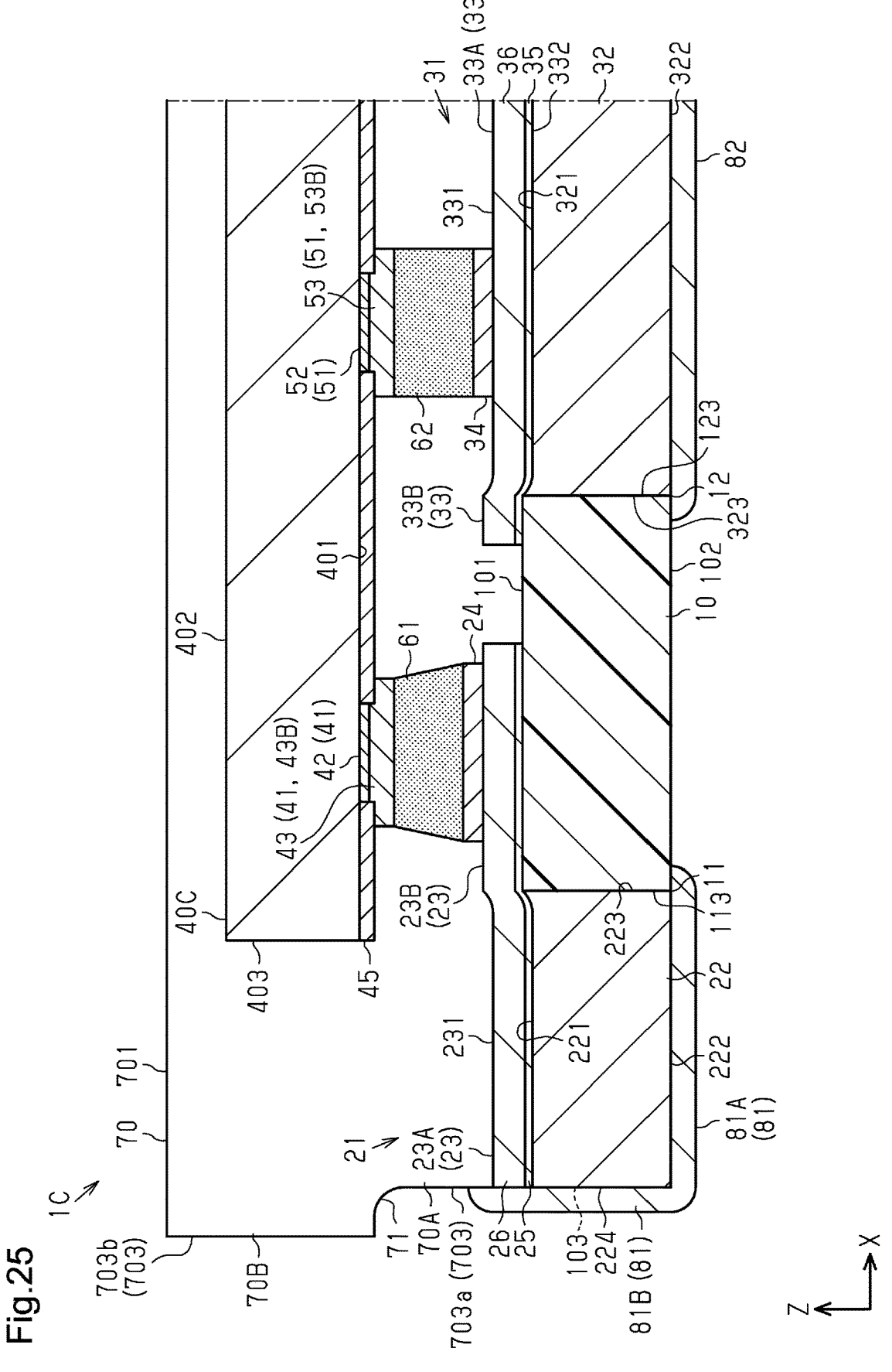
FIG. 25 is an enlarged cross-sectional view showing part of a modified example of the semiconductor device.

FIG. 25 shows a semiconductor device 1C including a semiconductor element 40C that differs in structure from the above embodiment.

In the semiconductor device 1C of this modified example, the first element electrodes 43 and the second element electrodes 53, which form the first connection pads 41 and the second connection pads 51, include the barrier layers 43B and 53B and do not include the conductive layers 43A and 53A shown in FIG. 5. The semiconductor device 1C has the same advantages as the above embodiment.

Figure 26:
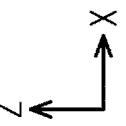
FIG. 26 is a cross-sectional view showing a modified example of the semiconductor device.
Figure 27:
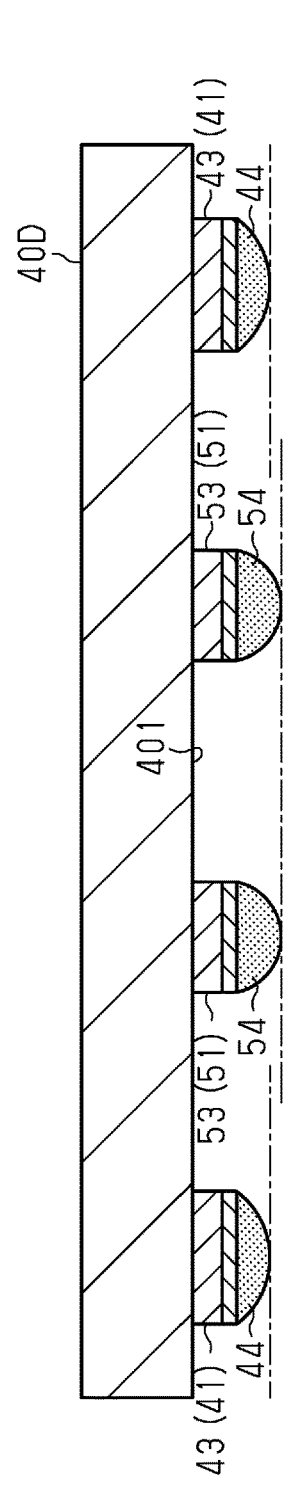
FIG. 27 is a cross-sectional view showing a wire electrode and a solder layer.
Figure 27:
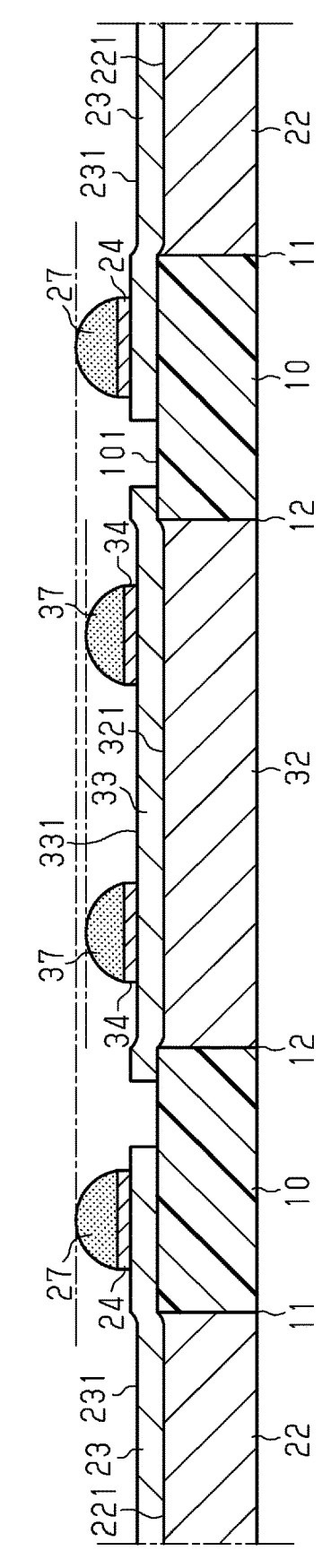
Figure 27:
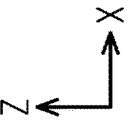

In a semiconductor device 1D shown in FIG. 26, the first wiring line electrodes 24 and the second wiring line electrodes 34 are equal in size, as viewed in the thickness direction Z. The second element electrodes 53 of a semiconductor element 40D are equal in size to the second wiring line electrodes 34. The first element electrodes 43 are larger than the second element electrodes 53 on the semiconductor element 40D. Thus, as shown in FIG. 27, the first element solder layer 44 has a smaller height than the second element solder layer 54. The difference in height is set to be equal to the difference in height in the thickness direction Z between the upper surface 331 of the second main surface wiring line 33 and the substrate main surface 101 of the substrate 10 so that the first substrate solder layer 27 contacts the first element solder layer 44 and so that the second substrate solder layer 37 contacts the second element solder layer 54. This joins the element electrodes 43 and 53 of the semiconductor element 40D with the wiring line electrodes 24 and 34 and reduces mounting failures of the semiconductor element 40D.

Figure 28:
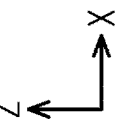
FIG. 28 is a cross-sectional view showing a modified example of the semiconductor device.
Figure 29:
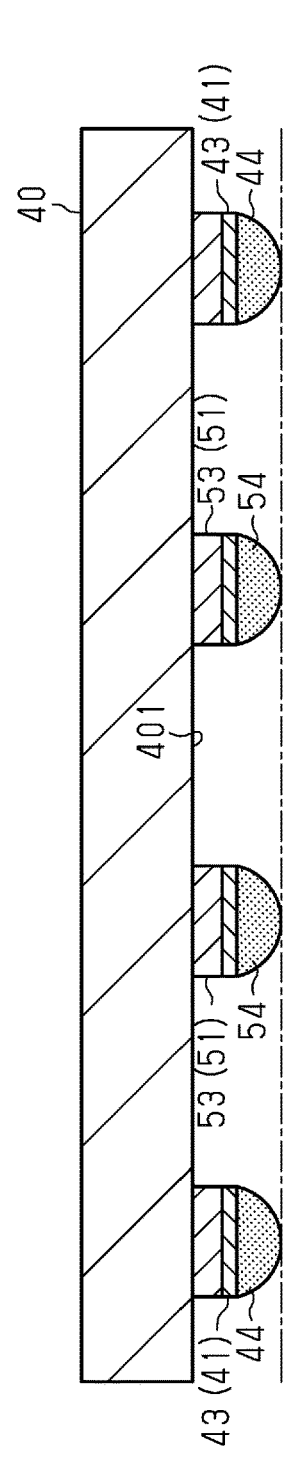
FIG. 29 is a cross-sectional view showing a wire electrode and a solder layer.
Figure 29:
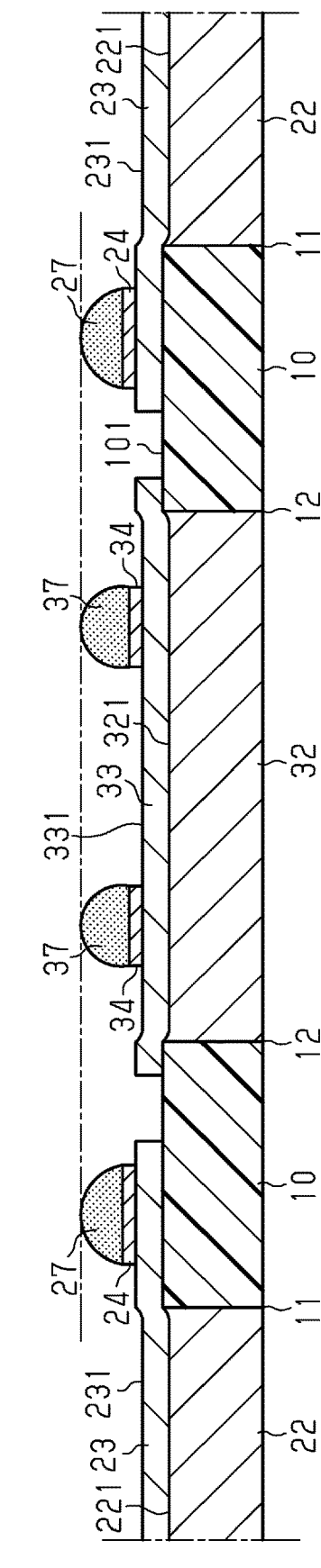
Figure 29:
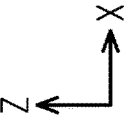

In a semiconductor device 1E shown in FIG. 28, the first wiring line electrodes 24 and the first element electrodes 43 are equal in size, as viewed in the thickness direction Z. The first element electrodes 43 are equal in size to the second element electrodes 53. The first wiring line electrodes 24 are larger than the second wiring line electrodes 34. Thus, as shown in FIG. 29, the height T12 of the second wiring line electrodes 34 and the second substrate solder layer 37 is greater than the height T11 of the first wiring line electrode 24 and the first substrate solder layer 27, and the peak P27 of the first substrate solder layer 27 and the peak P37 of the second substrate solder layer 37 are located at the same position. This allows for contact of the first substrate solder layer 27 with the first element solder layer 44 and contact of the second substrate solder layer 37 with the second element solder layer 54 in the same manner as the above embodiment. Consequently, the element electrodes 43 and 53 of the semiconductor element 40 are joined with the wiring line electrodes 24 and 34, and mounting failures of the semiconductor element 40 are reduced.

In the semiconductor device 1E, the first wiring line electrodes 24 are equal in size to the first element electrode 43 as viewed in the thickness direction Z. This reduces the stress acting on the first joining members 61 that connect the first wiring line electrodes 24 to the first element electrodes 43. Further, cracking of the first joining member 61 will be limited.

Figure 30:
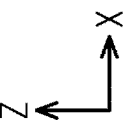
FIG. 30 is a cross-sectional view showing a modified example of the semiconductor device.

FIG. 30 shows a semiconductor device 1F including two second wiring portions 31. Three or more second wiring portions 31 can be included. The second wiring line electrodes 34 of the second wiring portions 31 are connected by the second joining members 62 to the second element electrodes 53 of the semiconductor element 40. The semiconductor device 1F has the same advantages as the above embodiment. Among signal lines that do not affect the electrical characteristics of the semiconductor element 40, the two second wiring portions 31 may be connected to the same signal line or to different signal lines. Further, at least one of the two second wiring portions 31 may be in a non-connected state.

REFERENCE SIGNS LIST 1A-1F) semiconductor device
10) substrate
101) substrate main surface
102) substrate back surface
103) substrate side surface
11) through hole
12) through hole
21) first wiring portion
22) first through-electrode
221) upper surface (first electrode upper surface)
23) first main surface wiring line
23A) connected wiring line portion
23B) substrate wiring line portion
231) upper surface (first wiring line upper surface)
24) first wiring line electrode
25) metal layer
26) conductive layer
27) first substrate solder layer
31) second wiring portion
32) second through-electrode
321) upper surface (second electrode upper surface)
33) second main surface wiring line
33A) connected wiring line portion
33B) extension
331) upper surface (second wiring line upper surface)
34) second wiring line electrode
35) metal layer
36) conductive layer
37) second substrate solder layer
40, 40B-40D) semiconductor element
401) element main surface
402) element back surface
403) element side surface
41) first connection pad
42) first electrode pad
43) first element electrode
44) first element solder layer
45) protective film
46) insulation film
47) rewiring layer

51) second connection pad
52) second electrode pad
53) second element electrode
54) second element solder layer
61) first joining member
62) second joining member
70) encapsulation resin
81) first external conductive film
82) second external conductive film
The invention claimed is:

1. A semiconductor device, comprising:
a substrate that includes a substrate main surface facing a thickness direction;
a semiconductor element that includes an element main surface facing the substrate main surface, a first element electrode formed on the element main surface, and a second element electrode formed on the element main surface;
a first through-electrode that extends through the substrate and includes a first electrode upper surface facing the same direction as the substrate main surface;
a second through-electrode that extends through the substrate and includes a second electrode upper surface facing the same direction as the substrate main surface;
a first main surface wiring line that contacts the substrate main surface and the first electrode upper surface and includes a first wiring line upper surface facing the same direction as the substrate main surface;
a second main surface wiring line that contacts the second electrode upper surface and includes a second wiring line upper surface facing the same direction as the substrate main surface;
a first wiring line electrode formed on the first wiring line upper surface;
a second wiring line electrode formed on the second wiring line upper surface;
a first joining member that joins the first element electrode and the first wiring line electrode; and
a second joining member that joins the second element electrode and the second wiring line electrode, wherein
the first electrode upper surface is recessed into the first through-electrode,
the second electrode upper surface is recessed into the second through-electrode, and
the first wiring line electrode is larger than the second wiring line electrode, as viewed in the thickness direction.

2. The semiconductor device according to claim 1, wherein the first element electrode and the second element electrode are equal in size, as viewed in the thickness direction.

3. The semiconductor device according to claim 1, wherein the second wiring line electrode and the second element electrode are equal in size, as viewed in the thickness direction.

4. The semiconductor device according to claim 1, wherein the second wiring line electrode is larger in size than the second element electrode, as viewed in the thickness direction.

5. The semiconductor device according to claim 1, wherein the first wiring line electrode and the first element electrode are equal in size, as viewed in the thickness direction.

6. The semiconductor device according to claim 1, wherein the first wiring line electrode is larger in size than the first element electrode, as viewed in the thickness direction.

7. A semiconductor device, comprising:
a substrate that includes a substrate main surface facing a thickness direction;
a semiconductor element that includes an element main surface facing the substrate main surface, a first element electrode formed on the element main surface, and a second element electrode formed on the element main surface;
a first through-electrode that extends through the substrate and includes a first electrode upper surface facing the same direction as the substrate main surface;
a second through-electrode that extends through the substrate and includes a second electrode upper surface facing the same direction as the substrate main surface;
a first main surface wiring line that contacts the substrate main surface and the first electrode upper surface and includes a first wiring line upper surface facing the same direction as the substrate main surface;
a second main surface wiring line that contacts the second electrode upper surface and includes a second wiring line upper surface facing the same direction as the substrate main surface;
a first wiring line electrode formed on the first wiring line upper surface;
a second wiring line electrode formed on the second wiring line upper surface;
a first joining member that joins the first element electrode and the first wiring line electrode; and
a second joining member that joins the second element electrode and the second wiring line electrode, wherein
the first electrode upper surface is recessed into the first through-electrode,
the second electrode upper surface is recessed into the second through-electrode, and
the first element electrode is larger than the second element electrode, as viewed in the thickness direction.

8. The semiconductor device according to claim 7, wherein the first wiring line electrode is equal in size to the second wiring line electrode, as viewed in the thickness direction.

9. The semiconductor device according to claim 7, wherein the second wiring line electrode and the second element electrode are equal in size, as viewed in the thickness direction.

10. The semiconductor device according to claim 7, wherein the second wiring line electrode is larger in size than the second element electrode, as viewed in the thickness direction.

11. The semiconductor device according to claim 7, wherein the first wiring line electrode and the first element electrode are equal in size, as viewed in the thickness direction.

12. The semiconductor device according to claim 7, wherein the first wiring line electrode is larger in size than the first element electrode, as viewed in the thickness direction.

13. The semiconductor device according to claim 1, wherein the first wiring line electrode is formed on the first wiring line upper surface that overlaps the substrate main surface.

14. The semiconductor device according to claim 1, wherein the first main surface wiring line and the second main surface wiring line are equal in thickness.

15. The semiconductor device according to claim 1, wherein sets of the second-through electrode, the second main surface wiring line, and the second wiring line electrode are arranged in a region that overlaps the semiconductor element, as viewed in the thickness direction.

16. The semiconductor device according to claim 1, wherein the second main surface wiring line includes an extension located outward from the second through-electrode, as viewed in the thickness direction.

17. The semiconductor device according to claim 1, comprising an encapsulation resin that covers the substrate main surface and the semiconductor element.

18. The semiconductor device according to claim 17, wherein the encapsulation resin is applied between the substrate main surface and the semiconductor element.

19. The semiconductor device according to claim 1, wherein the substrate includes a substrate back surface at a side opposite the substrate main surface in the thickness direction, the semiconductor device comprising:

a first external conductive film that covers the first through-electrode exposed from the substrate back surface; and a second external conductive film that covers the second through-electrode exposed from the substrate back surface.

20. The semiconductor device according to claim 19, wherein:

the substrate includes a substrate side surface that intersects the substrate main surface;

the first through-electrode includes an electrode side surface exposed from the substrate side surface; and the first external conductive film covers the electrode side surface of the first through-electrode.

21. The semiconductor device according to claim 20, wherein:

the first main surface wiring line includes a wire side surface exposed from the substrate side surface; and the first external conductive film covers the wire side surface of the first main surface wiring line.

22. The semiconductor device according to claim 1, wherein:

the semiconductor element includes an electrode pad; and the first element electrode and the second element electrode are disposed at positions overlapping the electrode pad in the thickness direction.

23. The semiconductor device according to claim 1, wherein:

the semiconductor element includes an electrode pad and a rewiring layer connected to the electrode pad; and the first element electrode and the second element electrode are connected to the rewiring layer and disposed at positions that do not overlap the electrode pad in the thickness direction.

* * * * *